(12) United States Patent
Lai et al.

(10) Patent No.: US 12,020,941 B2
(45) Date of Patent: Jun. 25, 2024

(54) DIPOLE-ENGINEERED HIGH-K GATE DIELECTRIC AND METHOD FORMING SAME

(71) Applicant: Taiwan Semiconductor Manufacturing Co., Ltd., Hsinchu (TW)

(72) Inventors: Te-Yang Lai, Hsinchu (TW); Chun-Yen Peng, Hsinchu (TW); Sai-Hooi Yeong, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/356,860

(22) Filed: Jul. 21, 2023

(65) Prior Publication Data

US 2023/0360918 A1 Nov. 9, 2023

Related U.S. Application Data

(62) Division of application No. 17/094,241, filed on Nov. 10, 2020, now Pat. No. 11,784,052.

(Continued)

(51) Int. Cl.
*H01L 21/28* (2006.01)
*H01L 21/3115* (2006.01)
(Continued)

(52) U.S. Cl.
CPC .... *H01L 21/28185* (2013.01); *H01L 21/3115* (2013.01); *H01L 21/823462* (2013.01);
(Continued)

(58) Field of Classification Search
CPC ............ H01L 21/31111; H01L 27/092; H01L 21/823462; H01L 29/66795;
(Continued)

(56) References Cited

U.S. PATENT DOCUMENTS 9,177,865 B2 11/2015 Kim et al.
10,181,427 B2 1/2019 Song et al.
(Continued)

FOREIGN PATENT DOCUMENTS

DE 102013204614 A1 9/2014
JP 2020010033 A 1/2020
(Continued)

*Primary Examiner* — Mouloucoulaye Inoussa
(74) *Attorney, Agent, or Firm* — Slater Matsil, LLP

(57) ABSTRACT

A method includes forming an oxide layer on a semiconductor region, and depositing a first high-k dielectric layer over the oxide layer. The first high-k dielectric layer is formed of a first high-k dielectric material. The method further includes depositing a second high-k dielectric layer over the first high-k dielectric layer, wherein the second high-k dielectric layer is formed of a second high-k dielectric material different from the first high-k dielectric material, depositing a dipole film over and contacting a layer selected from the first high-k dielectric layer and the second high-k dielectric layer, performing an annealing process to drive-in a dipole dopant in the dipole film into the layer, removing the dipole film, and forming a gate electrode over the second high-k dielectric layer.

20 Claims, 28 Drawing Sheets

Related U.S. Application Data

(60) Provisional application No. 63/031,099, filed on May 28, 2020.

(51) Int. Cl.
  *H01L 21/8234* (2006.01)
  *H01L 27/088* (2006.01)
  *H01L 29/51* (2006.01)

(52) U.S. Cl.
  CPC ........ *H01L 27/0886* (2013.01); *H01L 29/513* (2013.01); *H01L 21/823431* (2013.01)

(58) Field of Classification Search
  CPC ............... H01L 27/0886; H01L 29/513; H01L 21/3115; H01L 21/28185; H01L 21/823857; H01L 27/088; H01L 21/823431; H01L 21/823821; H01L 29/78; H01L 21/28088; H01L 29/66545; H01L 29/401; H01L 29/518; H01L 29/517; H01L 21/02183; H01L 21/02321; H01L 21/0228; H01L 29/4966; H01L 21/28176; H01L 29/0657; H01L 21/283; H01L 21/324; H01L 29/42356; H01L 29/785; H01L 21/32051; H01L 21/3215; H01L 21/28097; H01L 21/32055; H01L 29/51; H01L 29/4975; H01L 21/823475; H01L 29/0847; H01L 21/76802; H01L 21/823864; H01L 21/823871; H01L 21/823418; H01L 27/0203; H01L 29/665; H01L 21/30604; H01L 21/823814; H01L 27/1104; H01L 21/26513; H01L 27/0922; H01L 27/0924; H01L 21/76814; H01L 21/76897; H01L 27/0928; H01L 27/1116; H01L 23/485; H01L 21/76895; H01L 29/41791; H01L 21/76816; H01L 21/76846; H01L 23/53252; H01L 23/53209; H01L 23/53238; H01L 23/53266; H01L 23/53295; H01L 21/823807; H01L 29/42376; H01L 21/823456; H01L 29/4958; H01L 21/28247; H01L 21/28008; H01L 21/823842; H01J 37/32
  USPC ... 257/411, 331, 369, 401, 2, 296, 330, 412, 257/408, 204, 760, 758, 761, 288, 591, 257/751, 791, E29.242, E21.159; 438/595, 586, 212, 299, 270, 197, 283, 438/478, 300, 591, 640, 672, 622, 618, 438/637, 592, 589, 229
  See application file for complete search history.

(56) References Cited

U.S. PATENT DOCUMENTS

| | | |
|---|---|---|
| 10,297,453 B2 | 5/2019 | Tsai et al. |
| 10,312,340 B2 | 6/2019 | Kim et al. |
| 10,510,756 B1 | 12/2019 | Tsai et al. |
| 10,559,687 B2 | 2/2020 | Song et al. |
| 10,879,392 B2 | 12/2020 | Park et al. |
| 10,998,415 B2 | 5/2021 | JangJian et al. |
| 11,361,977 B2 | 6/2022 | Wang et al. |
| 2010/0052074 A1 | 3/2010 | Lin |
| 2011/0127616 A1 | 6/2011 | Hoentschel et al. |
| 2011/0215409 A1 | 9/2011 | Li |
| 2012/0049297 A1 | 3/2012 | Takeoka |
| 2012/0139062 A1 | 6/2012 | Yuan |
| 2012/0280288 A1 | 11/2012 | Ando |
| 2014/0103441 A1 | 4/2014 | Kim |
| 2014/0124872 A1 | 5/2014 | Kim et al. |
| 2014/0183649 A1 | 7/2014 | Lee et al. |
| 2014/0264626 A1 | 9/2014 | Yan et al. |
| 2015/0076623 A1 | 3/2015 | Tzou |
| 2015/0279745 A1 | 10/2015 | Xu |
| 2015/0295067 A1 | 10/2015 | Xu |
| 2016/0013107 A1 | 1/2016 | Won |
| 2016/0049478 A1 | 2/2016 | Song |
| 2016/0358860 A1 | 12/2016 | Alptekin |
| 2017/0133219 A1 | 5/2017 | Tak |
| 2017/0179252 A1 | 6/2017 | Tang et al. |
| 2017/0213826 A1 | 7/2017 | Kim |
| 2017/0278969 A1 | 9/2017 | Adusumilli |
| 2018/0012811 A1 | 1/2018 | Li |
| 2018/0122701 A1 | 5/2018 | Li |
| 2018/0145149 A1 | 5/2018 | Chiang |
| 2018/0151373 A1 | 5/2018 | Tsai |
| 2018/0197786 A1 | 7/2018 | Li |
| 2018/0247829 A1 | 8/2018 | Hou |
| 2018/0301371 A1 | 10/2018 | Wang |
| 2019/0006242 A1 | 1/2019 | Wang |
| 2019/0035916 A1 | 1/2019 | Chiu |
| 2019/0096681 A1 | 3/2019 | Wei |
| 2019/0097048 A1 | 3/2019 | Song |
| 2019/0139759 A1* | 5/2019 | Cheng ............... H01L 21/02321 |
| 2019/0279992 A1 | 9/2019 | Yu |
| 2019/0318967 A1 | 10/2019 | Chen |
| 2019/0341314 A1 | 11/2019 | Ando |
| 2019/0371675 A1 | 12/2019 | Tsai |
| 2020/0035678 A1* | 1/2020 | Lee ................. H01L 21/823842 |
| 2020/0075755 A1 | 3/2020 | Kao |
| 2020/0105606 A1 | 4/2020 | Lin |
| 2020/0127054 A1* | 4/2020 | Ando ................... H10N 70/021 |
| 2020/0135475 A1 | 4/2020 | Cheng |
| 2020/0135915 A1* | 4/2020 | Savant ................ H01L 21/0228 |
| 2020/0176581 A1 | 6/2020 | Lee |
| 2020/0273700 A1 | 8/2020 | Cheng |
| 2020/0287013 A1 | 9/2020 | Lee |
| 2020/0357700 A1* | 11/2020 | Wang .................. H01L 29/4966 |
| 2020/0395461 A1 | 12/2020 | Kim |
| 2020/0411635 A1* | 12/2020 | Lajoie ................. H01L 27/1255 |
| 2021/0134951 A1* | 5/2021 | Chen ............... H01L 21/823857 |
| 2021/0273070 A1 | 9/2021 | Lee |
| 2021/0376104 A1* | 12/2021 | More .............. H01L 21/823821 |

FOREIGN PATENT DOCUMENTS

| | | |
|---|---|---|
| KR | 20140142957 A | 12/2014 |
| KR | 20160078218 A | 7/2016 |
| KR | 20160095399 A | 8/2016 |
| KR | 20160129664 A | 11/2016 |
| KR | 20170015055 A | 2/2017 |
| KR | 20170105742 A | 9/2017 |
| KR | 20180091245 A | 8/2018 |
| KR | 20190022255 A | 3/2019 |
| KR | 20190033770 A | 4/2019 |
| TW | 202013519 A | 4/2020 |

\* cited by examiner

DIPOLE-ENGINEERED HIGH-K GATE DIELECTRIC AND METHOD FORMING SAME

PRIORITY CLAIM AND CROSS-REFERENCE

This application is a divisional of U.S. patent application Ser. No. 17/094,241, filed Nov. 10, 2020, and entitled "Dipole-Engineered High-K Gate Dielectric and Method Forming Same," which claims the benefit of the U.S. Provisional Application No. 63/031,099, filed on May 28, 2020, and entitled "Novel High-k Gate Oxide Stack Engineering for Device Performance Boost," which applications are hereby incorporated herein by reference.

BACKGROUND

Metal-Oxide-Semiconductor (MOS) devices are basic building elements in integrated circuits. Recent development of the MOS devices includes forming replacement gates, which include high-k gate dielectrics and metal gate electrodes over the high-k gate dielectrics. The formation of a replacement gate typically involves depositing a high-k gate dielectric layer and metal layers over the high-k gate dielectric layer, and then performing Chemical Mechanical Polish (CMP) to remove excess portions of the high-k gate dielectric layer and the metal layers. The remaining portions of the metal layers form the metal gates.

In conventional formation methods of the MOS devices, the threshold voltages of the MOS devices may be adjusted by performing a thermal anneal process when conducting ammonia to treat the high-k dielectric layers. Although the threshold voltage can be changed, it was difficult to adjust the threshold voltages to intended values, and further adjustment had to be achieved by adopting different work-function metals and adjusting the thickness of the work-function metals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
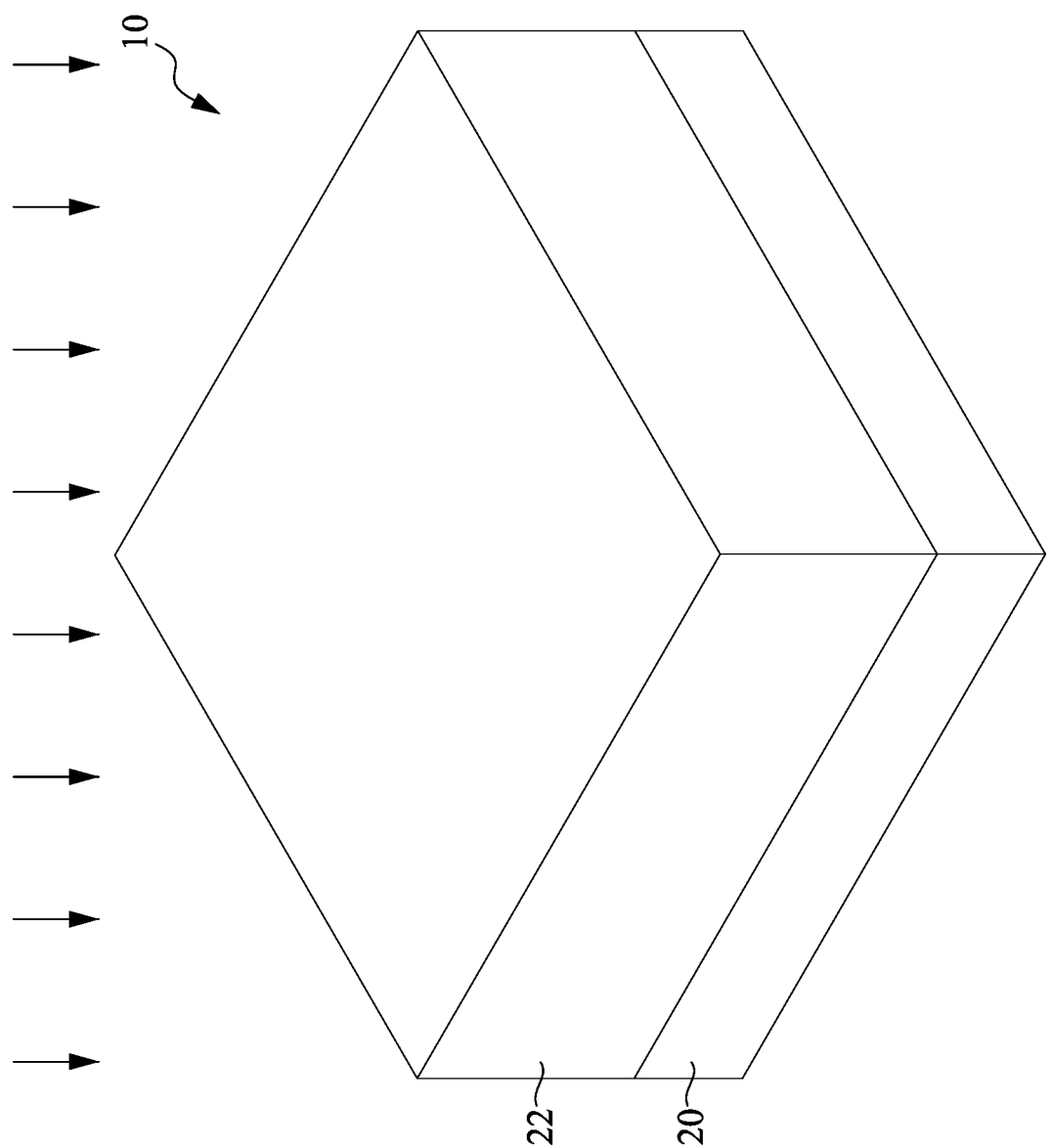
FIGS. 1-6, 7A, 7B, 7C, 8A, 8B, 9A, 9B, and 10-20 illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with dipole-engineered high-k dielectric layers and the method of incorporating the dipole dopants into the high-k dielectric layers are provided in accordance with various embodiments. Dipole dopants are diffused into the high-k dielectric layers through thermal diffusion. The threshold voltages of the corresponding transistors are adjusted. The magnitude of the adjustment depends from the material of high-k dielectric layer and the position of the doping. Accordingly, more than one high-k dielectric layers are formed, which may have different dielectric constant (k) values. The dipole dopants may be selectively doped into one or more of the high-k dielectric layers to provide different threshold-voltage adjustment ability. Furthermore, device performance is improved through doping the dipole dopants. The Capacitance Equivalent Thickness (CET) of the high-k dielectric layers is reduced. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors and Gate-All-Around (GAA) transistors may also adopt the concept of the present disclosure.

Figure 24:
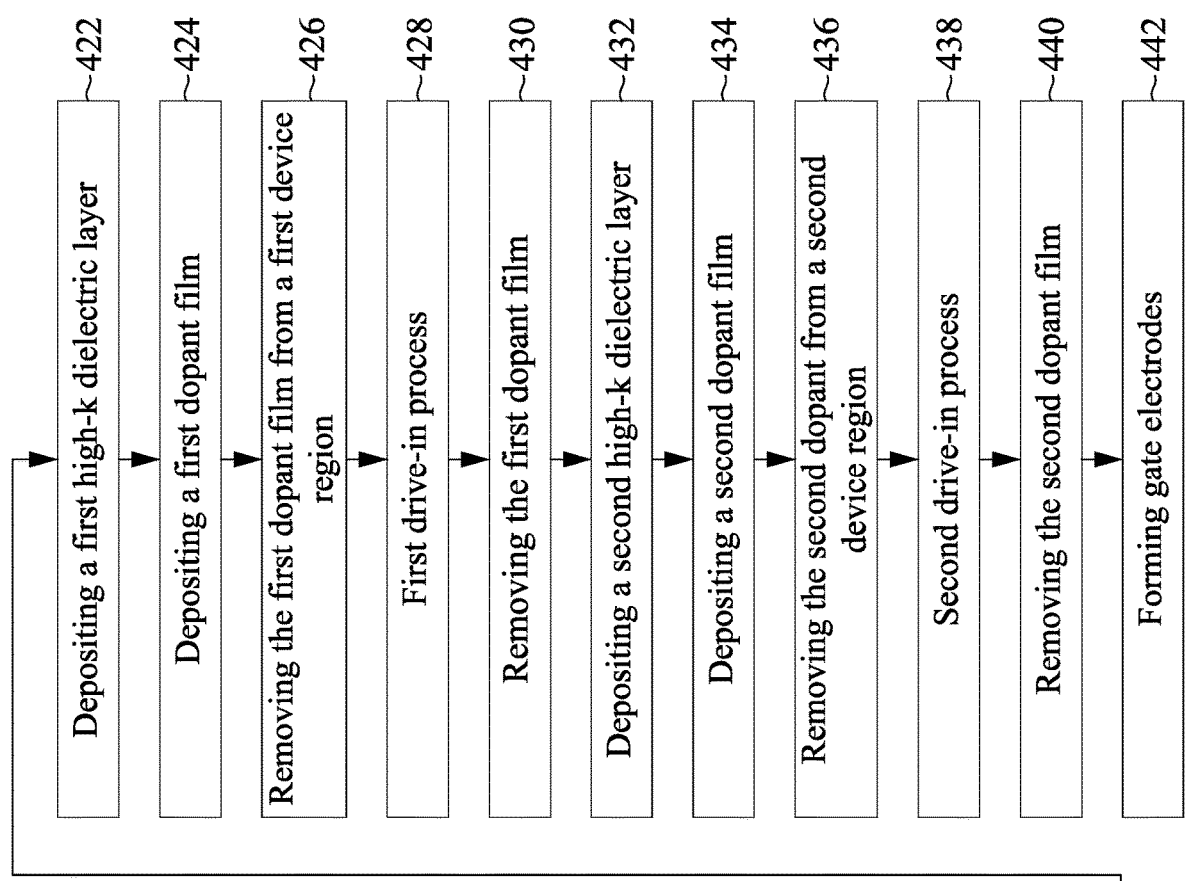
FIG. 24 illustrates a process flow for forming FinFETs in accordance with some embodiments.

FIGS. 1-6, 7A, 7B, 7C, 8A, 8B, 9A, 9B, and 10-20 illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 as shown in FIG. 24.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon;

germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 as shown in FIG. 24. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
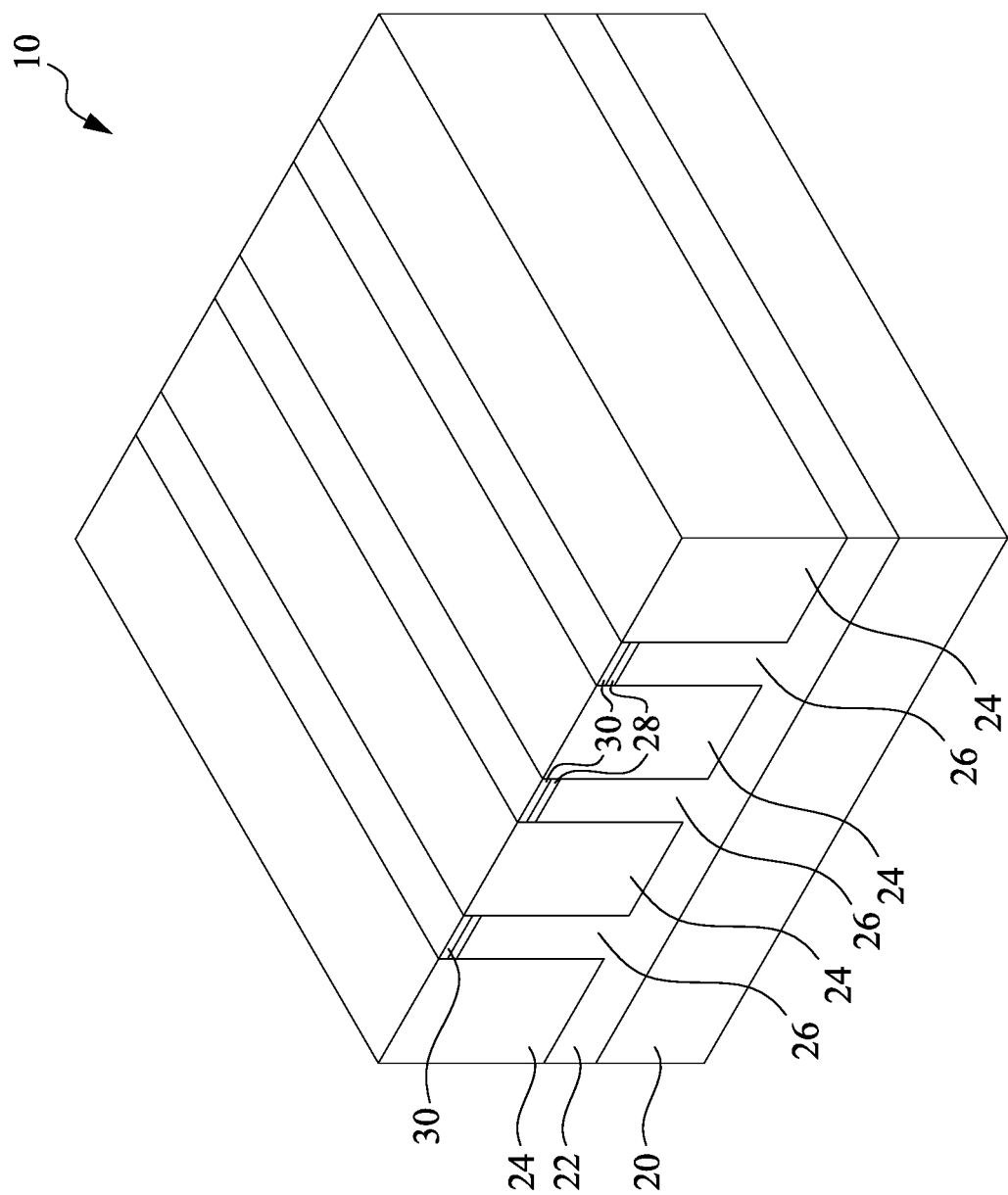

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 as shown in FIG. 24. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitriding of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
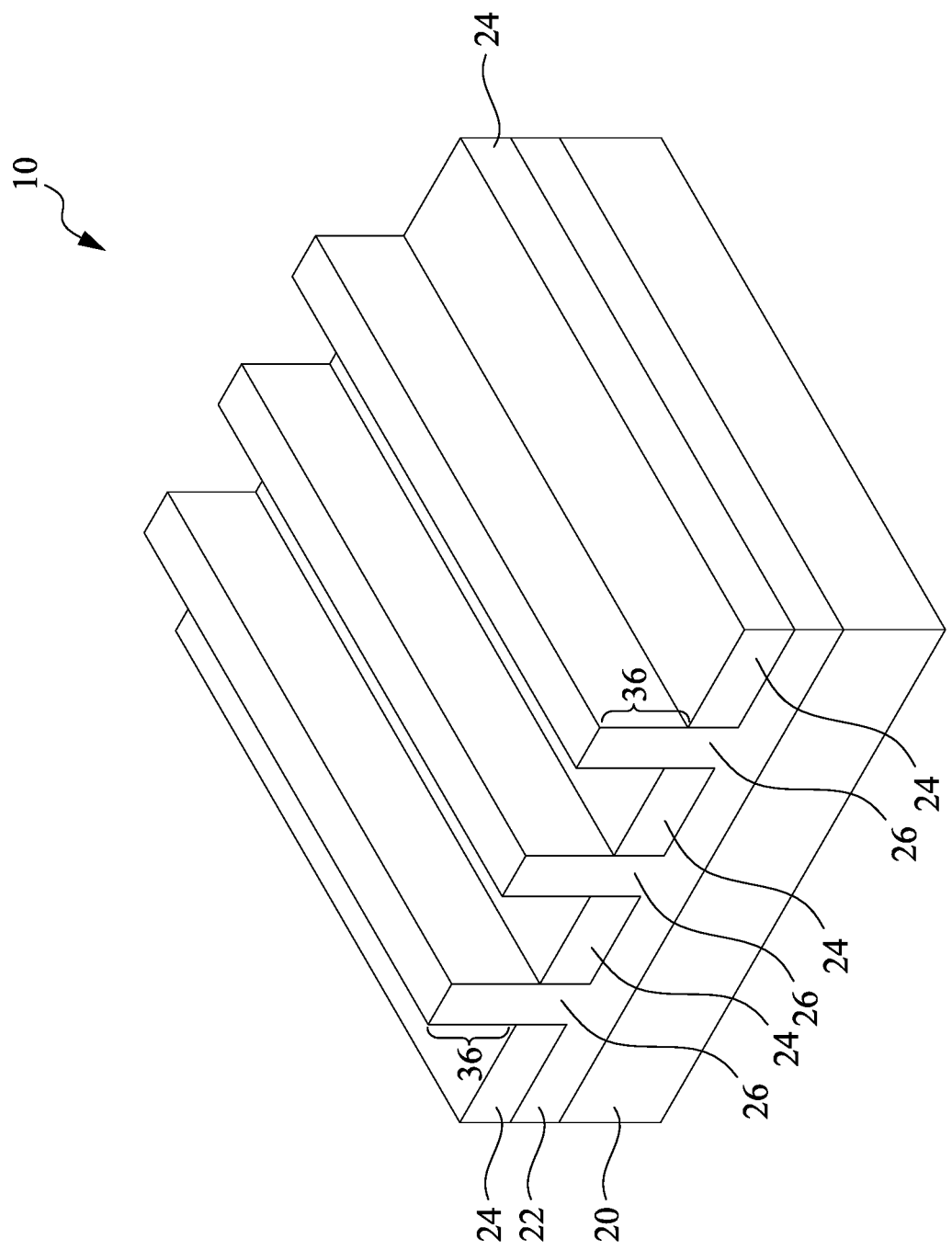

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 as shown in FIG. 24. The etching may be performed using a dry etching process, wherein the mixture of HF and NH$_3$, for example, is used as the etching gas. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
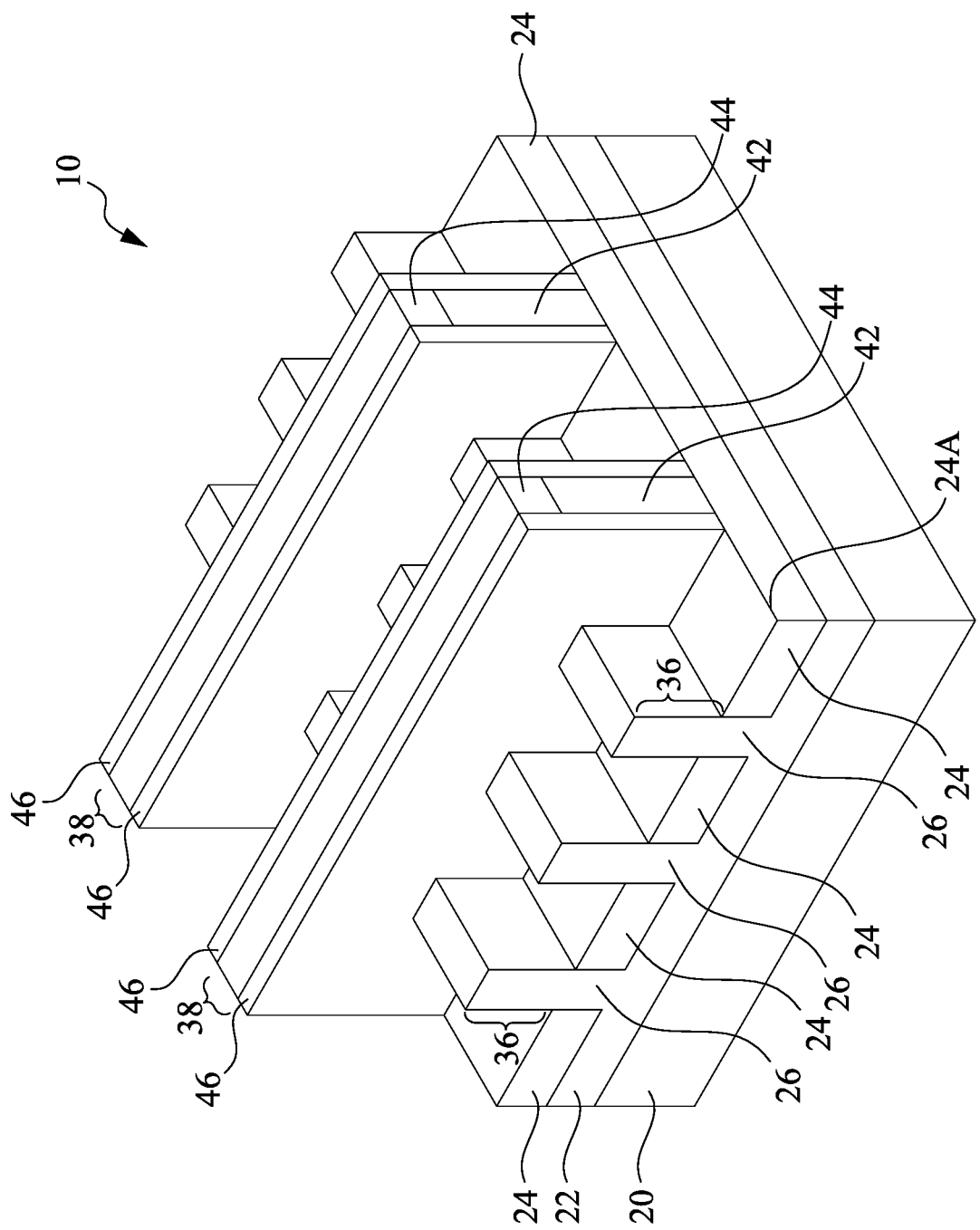

Referring to FIG. 4, dummy gate stacks 38 are formed to extend on the top surfaces and the sidewalls of (protruding) fins 36. The respective process is illustrated as process 408 in the process flow 400 as shown in FIG. 24. Dummy gate stacks 38 may include dummy gate dielectrics 40 (shown in FIGS. 7B and 7C) and dummy gate electrodes 42 over dummy gate dielectrics 40. Dummy gate electrodes 42 may be formed, for example, using polysilicon or amorphous silicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 as shown in FIG. 24. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
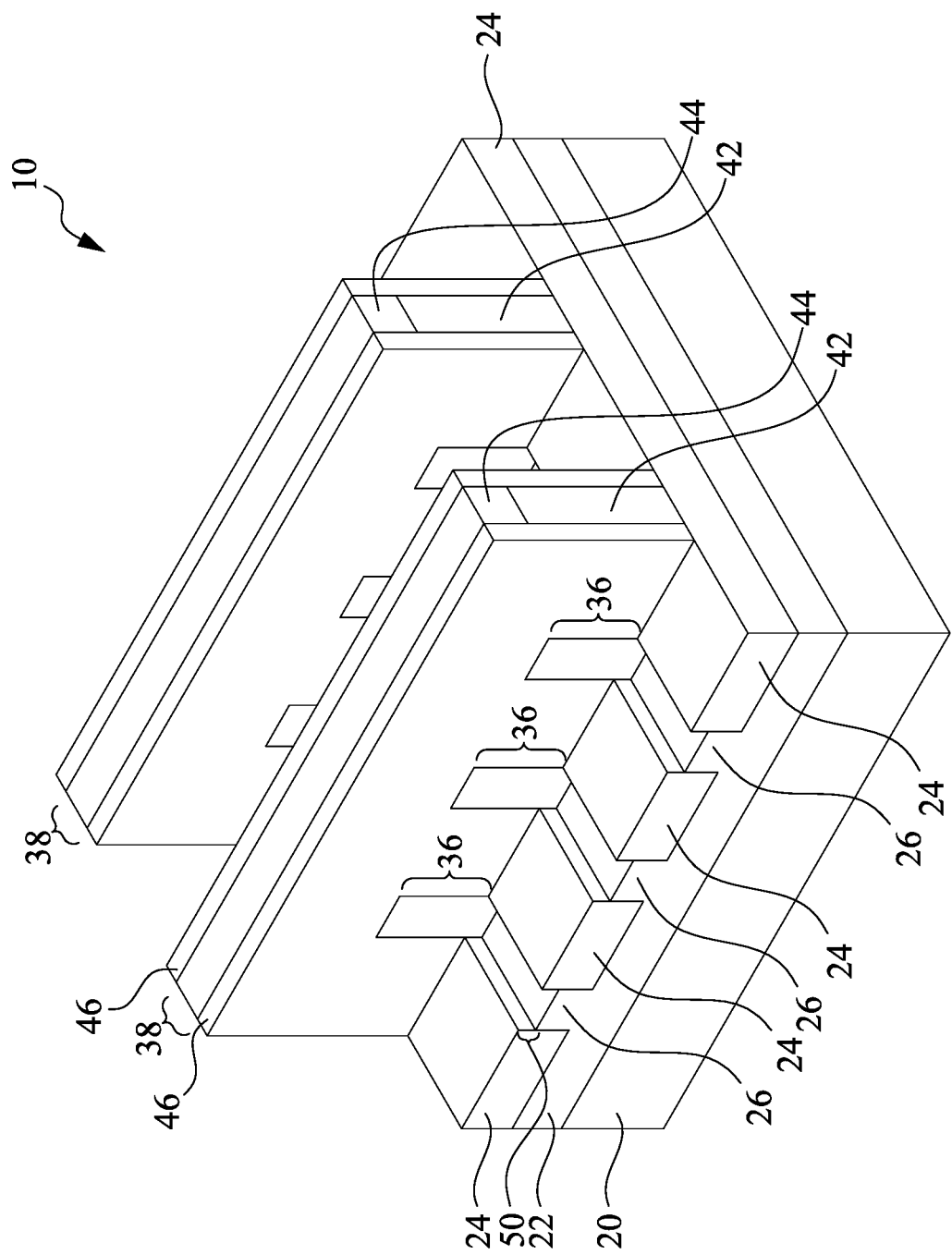

The portions of protruding fins 36 that are not covered by dummy gate stacks 38 and gate spacers 46 are then etched, resulting in the structure shown in FIG. 5. The respective process is illustrated as process 410 in the process flow 400 as shown in FIG. 24. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
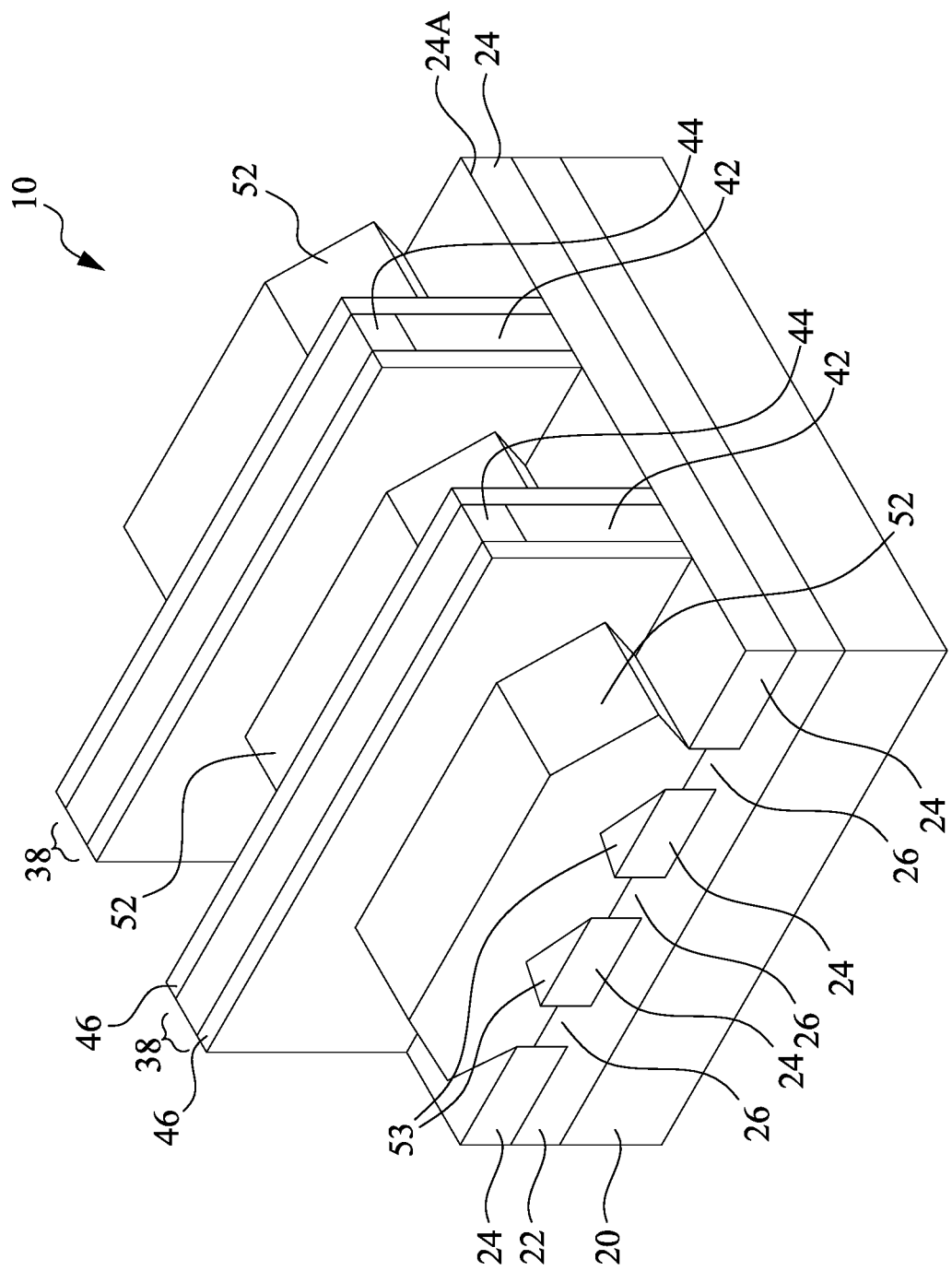

Next, epitaxy regions (source/drain regions) 52 are formed by selectively growing (through epitaxy) a semiconductor material in recesses 50, resulting in the structure in FIG. 6. The respective process is illustrated as process 412 in the process flow 400 as shown in FIG. 24. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 52 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 52, the further epitaxial growth of epitaxy regions 52 causes epitaxy regions 52 to expand horizontally, and facets may be formed. The further growth of epitaxy regions 52 may also cause neighboring epitaxy regions 52 to merge with each other. Voids (air gaps) 53 may be generated.

After the epitaxy process, epitaxy regions 52 may be further implanted with a p-type or an n-type impurity to form source and drain regions, which are also denoted using reference numeral 52. In accordance with alternative embodiments of the present disclosure, the implantation process is skipped when epitaxy regions 52 are in-situ doped with the p-type or n-type impurity during the epitaxy.

Figure 7A:
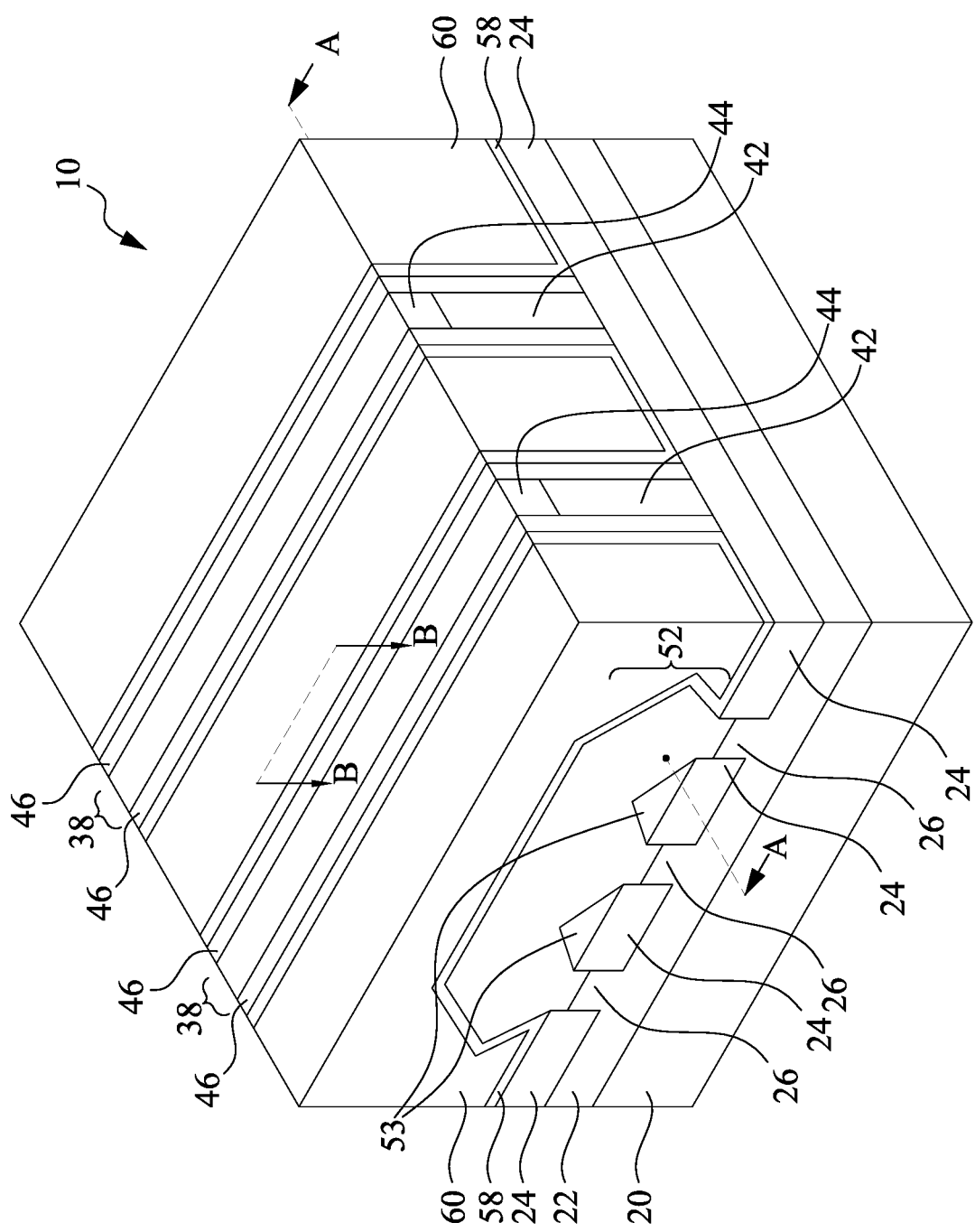

FIG. 7A illustrates a perspective view of the structure after the formation of Contact Etch Stop Layer (CESL) 58 and Inter-Layer Dielectric (ILD) 60. The respective process is illustrated as process 414 in the process flow 400 as shown in FIG. 24. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
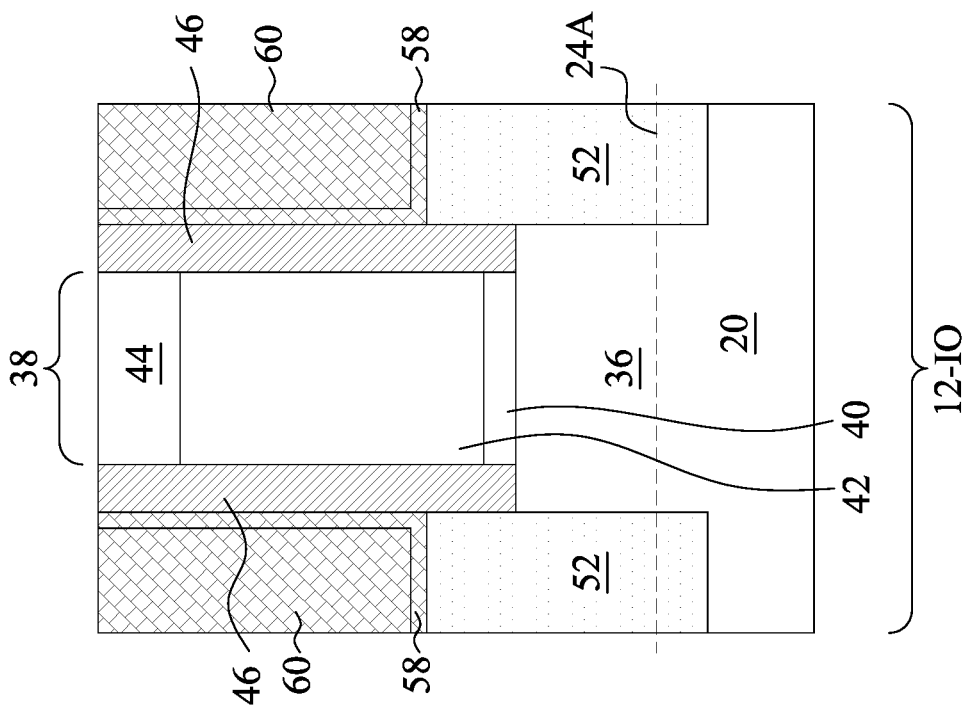
Figure 7B:
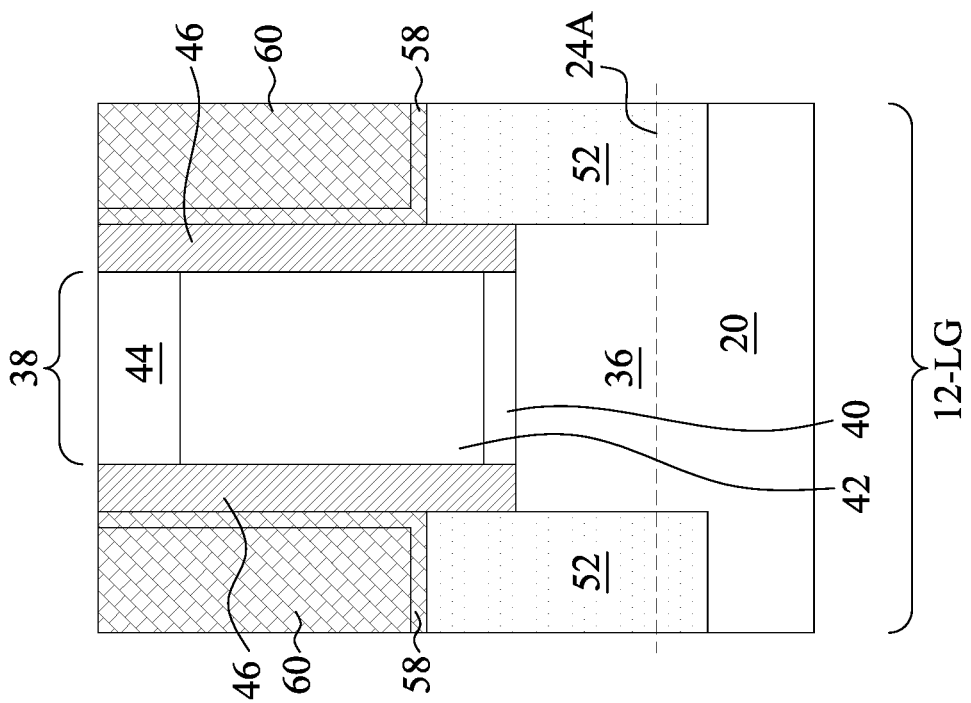
Figure 7C:
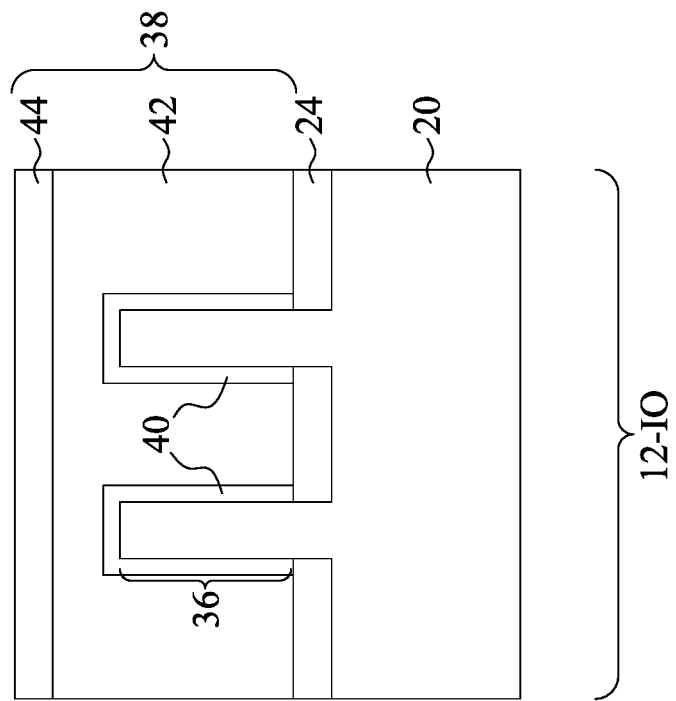
Figure 7C:
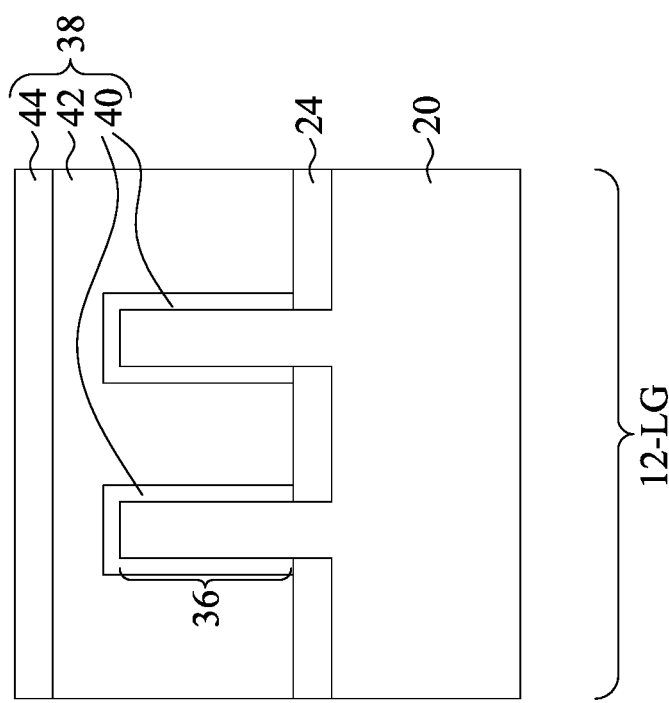

FIGS. 7B and 7C illustrate the cross-sectional views of an intermediate structure in the formation of a first FinFET and a second FinFET on the same substrate 20 (and in the same die and the same wafer). The cross-sectional views of both of the first FinFET and the second FinFET shown in FIG. 7B may correspond to the cross-sectional view obtained from the vertical plane containing line A-A in FIG. 7A. The cross-sectional views of both of the first FinFET and the second FinFET shown in FIG. 7C may correspond to the cross-sectional view obtained from the vertical plane containing line B-B in FIG. 7A. In accordance with some embodiments, the first FinFET is a logic device (sometimes referred to as a core device), and is formed in device region 12-LG. The second FinFET is an input-output (IO) device formed in device region 12-IO.

Figure 8A:
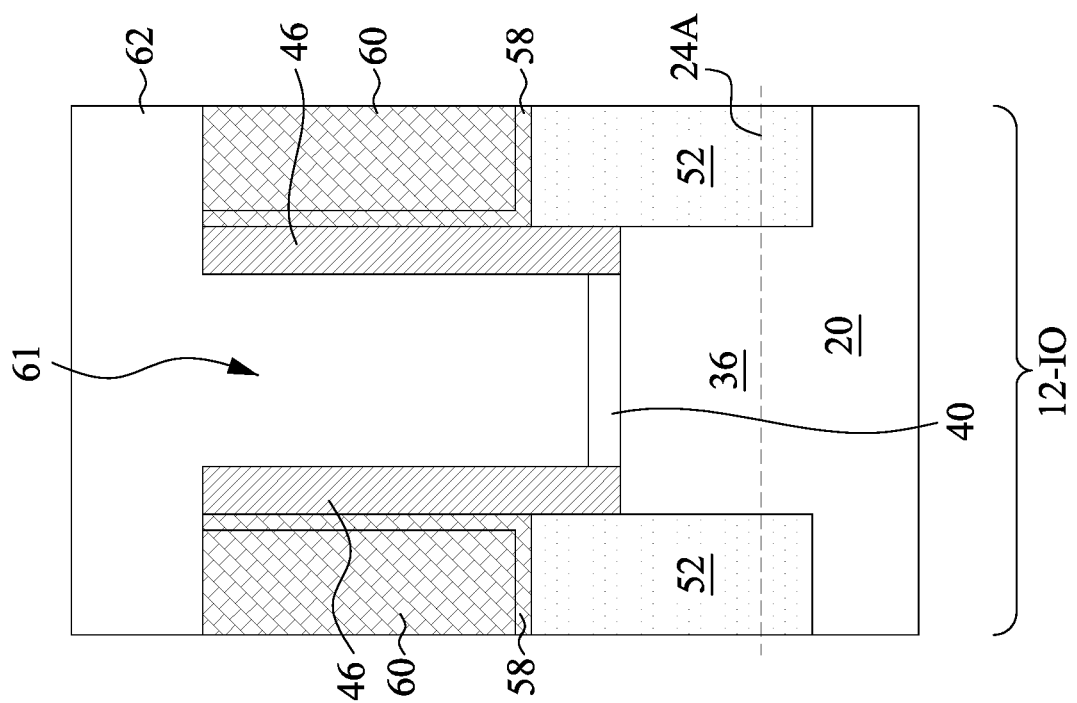
Figure 8A:
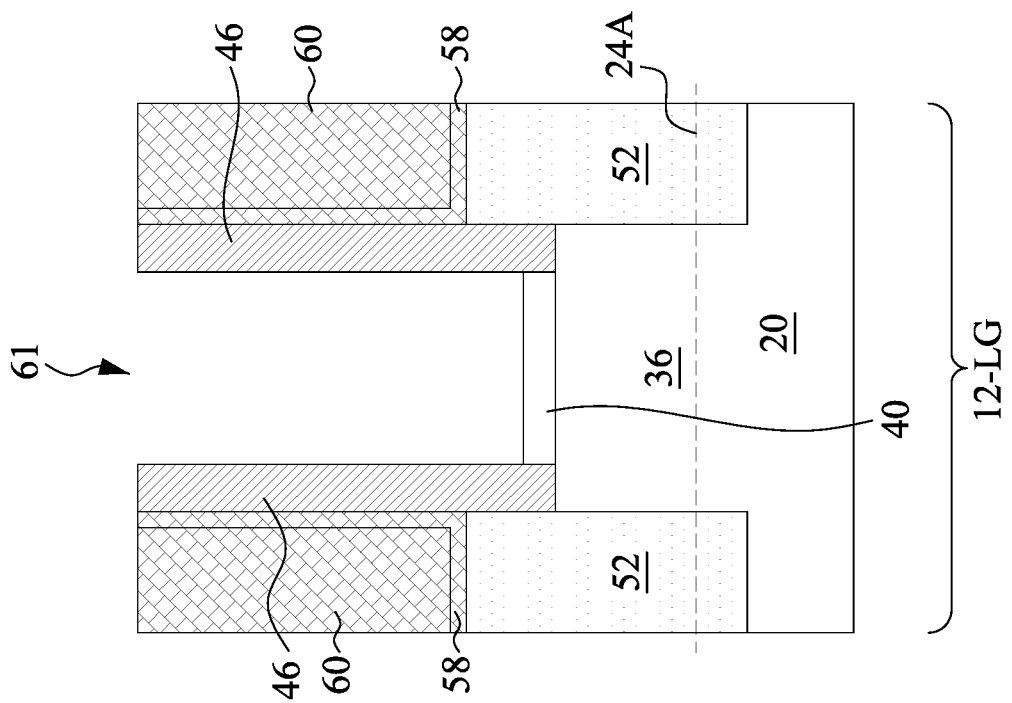
Figure 8B:
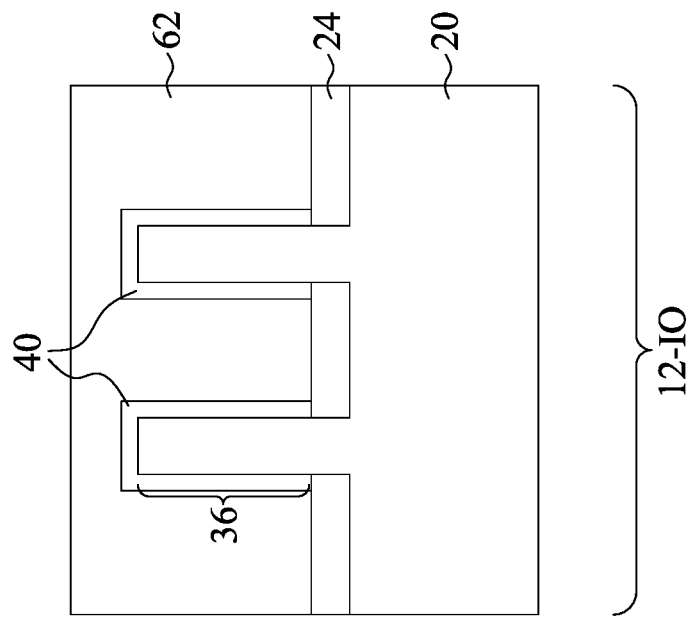
Figure 8B:
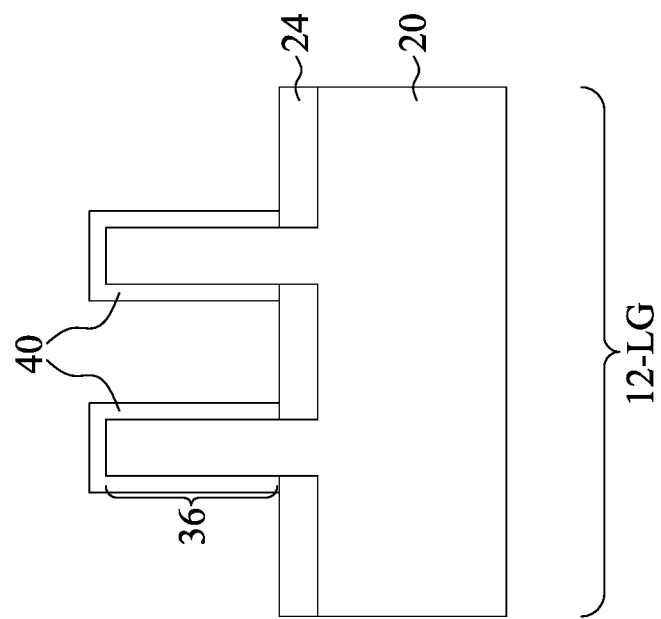

After the structure shown in FIGS. 7A, 7B, and 7C is formed, hard mask layers 44 and dummy gate electrodes 42 are removed, forming openings 61 as shown in FIG. 8A. The respective process is illustrated as process 416 in the process flow 400 as shown in FIG. 24. The top surfaces and the sidewalls of protruding fins 36 in device regions 12-LG and 12-IO are both exposed. Next, an etching mask such as a photo resist 62 is formed in device region 12-IO to protect the dummy gate dielectric 40 in device region 12-IO. FIG. 8B illustrates the structure in another cross-section.

Figure 9A:
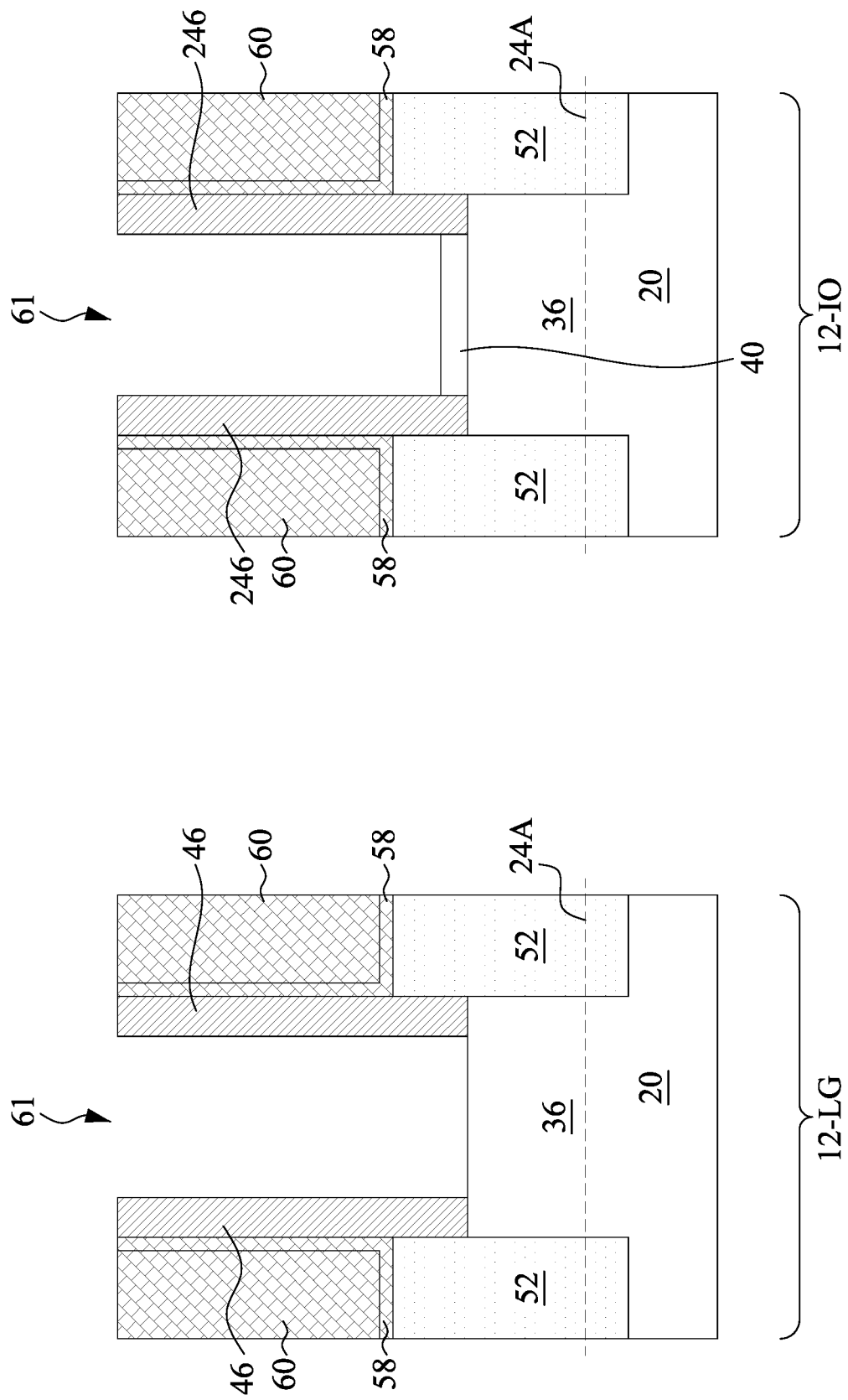
Figure 9B:
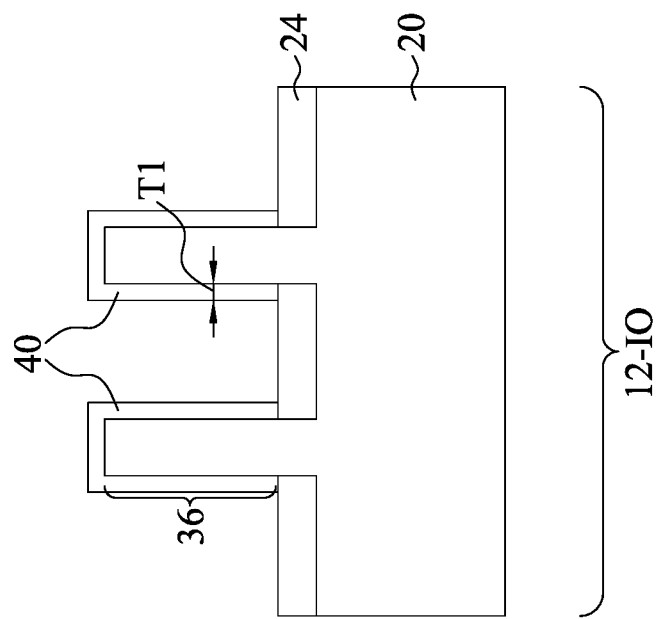
Figure 9B:
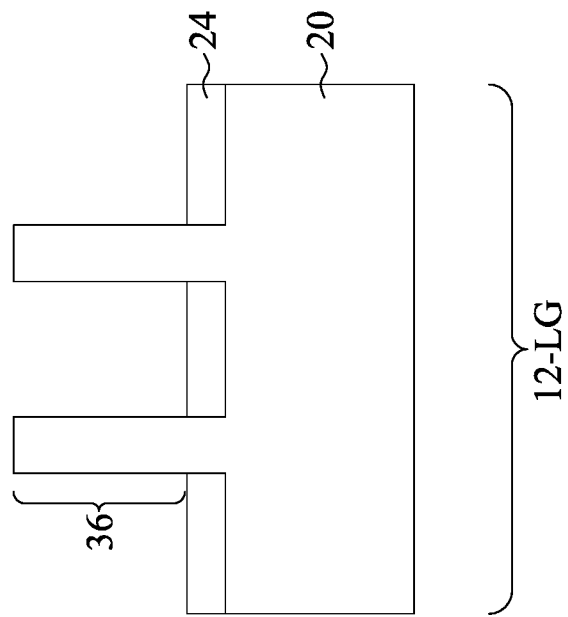

In a subsequent process, the dummy gate dielectric 40 in device region 12-LG is removed, for example, through an isotropic etching process, which may be a dry etching process or a wet etching process. Etching mask 62 (FIGS. 8A and 8B) is then removed. The resulting structure is shown in FIGS. 9A and 9B. The respective process is illustrated as process 418 in the process flow 400 as shown in FIG. 24.

FIGS. 10 through 20 illustrate the formation of gate stacks of a FinFET in device region 100 and a FinFET in device region 200, and the dipole-engineering process in accordance with some embodiments. In accordance with some embodiments, each of device regions 100 and 200 may be selected from a core device region, an IO device region, a memory device region, or the like, in any combination. For example, device region wo may be a core device region (such as region 12-LG in FIGS. 9A and 9B), while device region 200 may be an IO device region (such as region 12-IO in FIGS. 9A and 9B). Device regions 100 and 200 may also both be core device regions, both be IO regions, both be memory regions, or the like. Furthermore, each of the first FinFET and the second FinFET may be an n-type FinFET or a p-type FinFET in any combination. For example, both of the FinFETs in device regions 100 and 200 may be n-type FinFETs or p-type FinFETs in accordance with some embodiments. In accordance with alternative embodiments of the present disclosure, the FinFET in device region 100 is an n-type FinFET, and the FinFET in device region 200 is a p-type FinFET. Alternatively, the FinFET in device region 100 is a p-type FinFET, and the FinFET in device region 200 is an n-type FinFET. In the subsequent illustrated example, it is assumed that both of device regions 100 and 200 are logic FinFETs, and the corresponding gate dielectrics 40 are replaced with interfacial layers. In accordance with alternative embodiments, one or both of the device regions 100 and 200 are IO device regions. The formation of replacement gate stacks for the IO devices are essentially the same as what are shown in FIGS. 10 through 20, except gate dielectric 40 is not replaced with interfacial layers.

To distinguish the features in device region 100 from the features in device region 200, the features in device region 100 may be represented using the reference numerals of the corresponding features in FIG. 7A plus number 100, and the features in device region 200 may be represented using the reference numerals of the corresponding features in FIG. 7A plus number 200. For example, the source/drain regions 152 and 252 in FIG. 10 correspond to source/drain region 52 in FIG. 7A, and gate spacers 146 and 246 in FIG. 10 correspond to the gate spacers 46 in FIG. 7A.

Figure 10:
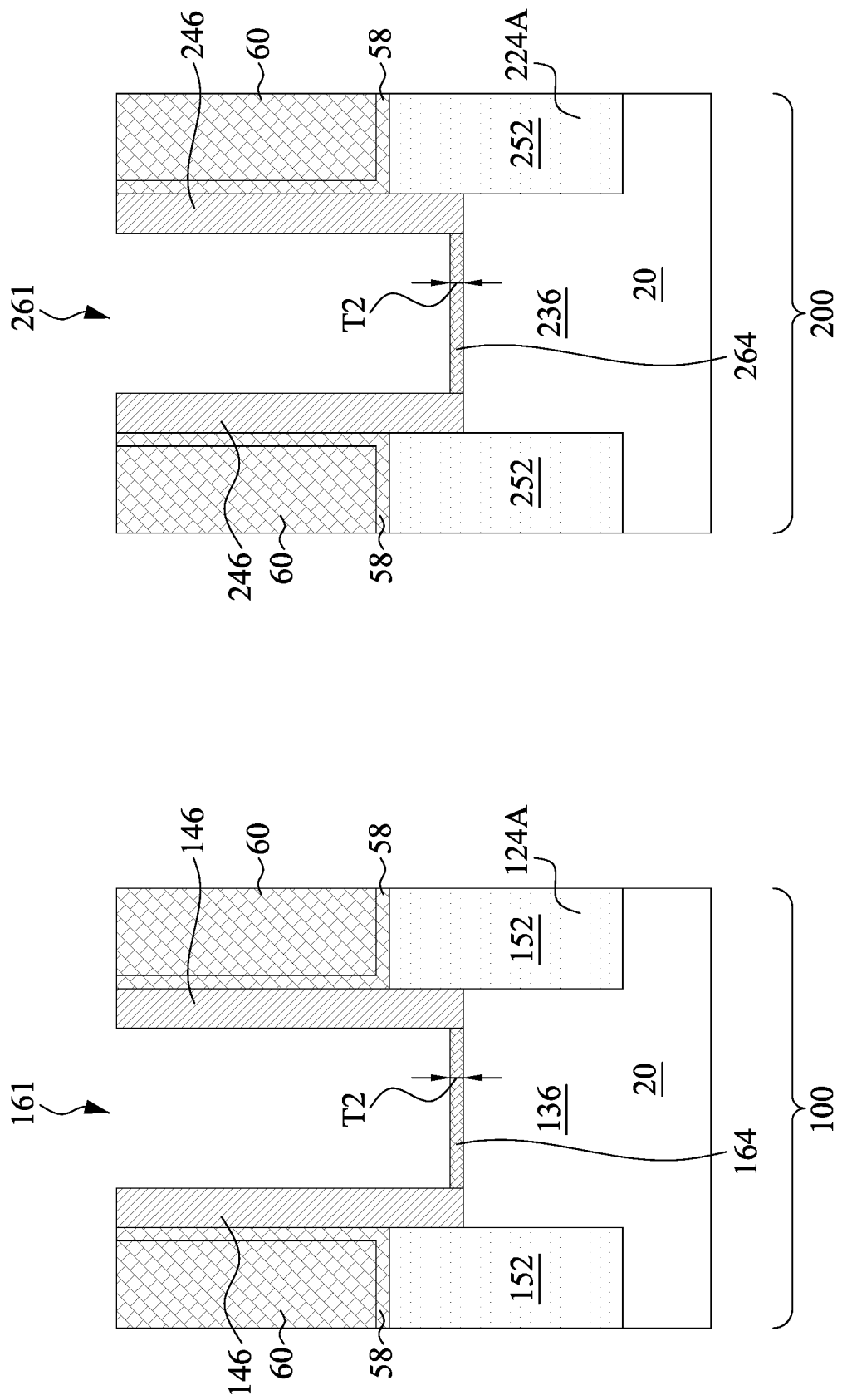

Referring to FIG. 10, interfacial layers (ILs) 164 and 264 are formed. The respective process is illustrated as process 420 in the process flow 400 as shown in FIG. 24. ILs 164 and 264 are formed on the top surfaces and the sidewalls of protruding fins 136 and 236, wherein FIG. 10 illustrates the portions of ILs 164 and 264 on the top surfaces of protruding fins 136 and 236. In accordance with alternative embodiments, in which one of device region is an IO region, the original gate dielectric 40 (FIG. 9B) remains, and the subsequently deposited high-k dielectric layer is formed over the original gate dielectric 40. ILs 164 and 264 may include oxide layers such as silicon oxide layers, which are formed through a thermal oxidation process or a chemical oxidation process to oxidize the surface portions of protruding fins 136 and 236. ILs 164 and 264 may also be formed through a deposition process. The chemical oxidation process may be performed using a chemical solution (sometimes referred to as Standard Clean 1 (SC1) solution), which comprises $NH_4OH$, $H_2O_2$, and $H_2O$. The chemical oxidation process may also be performed using a Sulfuric Peroxide Mixture (SPM) solution, which is the solution of sulfuric acid and hydrogen peroxide. Alternatively, the chemical oxidation process may be performed using a chemical solution including ozone ($O_3$) dissolved in water.

In accordance with alternative embodiments, ILs 164 and 264 are formed through thermal oxidation, which may be performed in process gases such as $N_2O$, $O_2$, the mixture of $N_2O$ and $H_2$, the mixture of $H_2$ and $O_2$, or the like. The oxidation temperature may be in the range between about 500° C. and about 1,000° C. In accordance with some embodiments, gate dielectric 40 of the IO device has a thickness T1 (FIG. 9B) greater than about 15 Å, and may be in the range between about 15 Å and about 50 Å. The thickness T2 of the replacement ILs (such as the ILs 164 and 264 in FIG. 10) is smaller than thickness T1. In accordance with some embodiments, thickness T2 is in the range between about 5 Å and about 15 Å.

Figure 11:
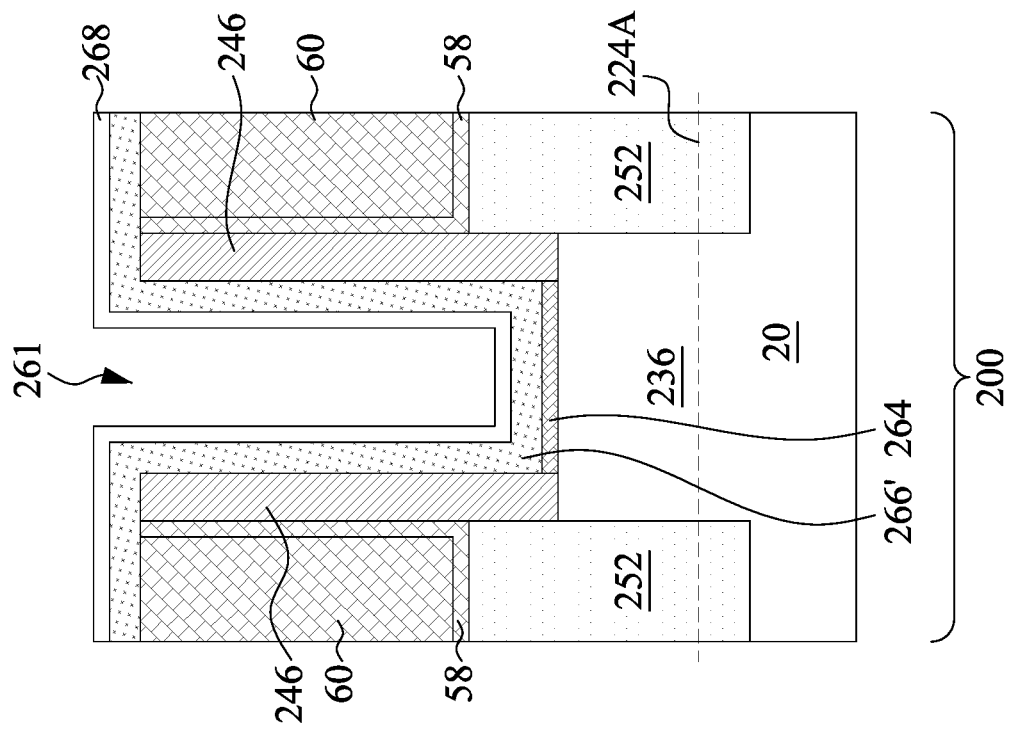
Figure 11:
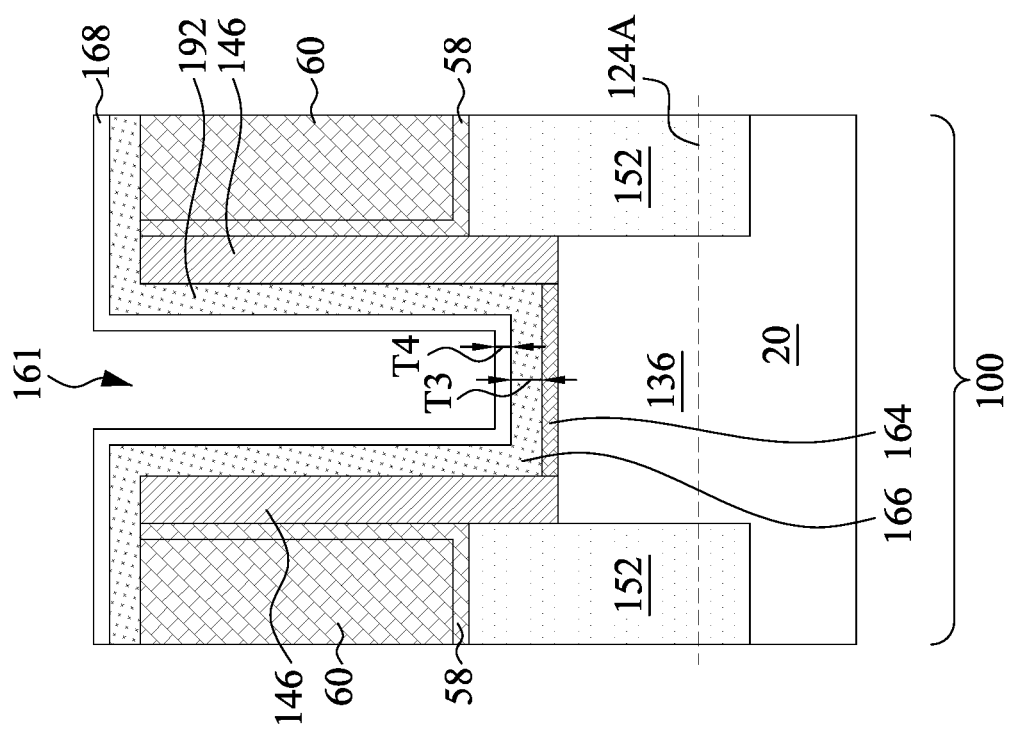

Next, referring to FIG. 11, first high-k dielectric layers 166 and 266 are deposited over the corresponding ILs 164 and 264. The respective process is illustrated as process 422 in the process flow 400 as shown in FIG. 24. High-k dielectric layers 166 and 266 may be formed of a high-k dielectric material such as hafnium oxide ($HfO_2$), zirconium oxide ($ZrO_2$), titanium oxide ($TiO_2$), or the like, or the combinations thereof such as HfZrO, HMO, or the like. The high-k dielectric material may be pure (such as pure $HfO_2$, pure $ZrO_2$, or pure $TiO_2$) or substantially pure (for example, with the atomic percentage being greater than about 90 or 95 percent). The dielectric constant (k-value) of the high-k dielectric material is higher than 3.9, and may be higher than about 7.0. High-k dielectric layers 166 and 266 are overlying, and may physically contact, the respective underlying ILs 164 and 264 (or gate dielectric layers 40). High-k dielectric layers 166 and 266 are formed as conformal layers, and extend on the sidewalls of protruding fins 136 and 236 and the top surfaces and the sidewalls of gate spacers 146 and 246, respectively. In accordance with some embodiments of the present disclosure, high-k dielectric layers 166 and 266 are formed using ALD or CVD. The deposition temperature may be in the range between about 200° C. and about 400° C. The thickness T3 may be in the range between about 6 Å and about 20 Å. First high-k dielectric layers 166 and 266 may be deposited in a common process, and hence are formed of the same material, or may be deposited in different processes, and may be formed of different materials.

Further referring to FIG. 11, a first dipole film is deposited in a deposition process. The respective process is illustrated as process 424 in the process flow 400 as shown in FIG. 24. The dipole film includes dipole film (portion) 168 in device region 100, and dipole film (portion) 268 in device region 200. Dipole films 168 and 268 are formed through a conformal deposition process such as an ALD process or a CVD process, so that the horizontal thickness of the horizontal portions and the vertical thickness of the vertical portions of dipole films 168 and 268 are substantially equal to each other, for example, with the variation in the thicknesses having a difference smaller than about 20 percent or 10 percent. In accordance with some embodiments of the present disclosure, dipole films 168 and 268 extend into openings 161 and 261, and include some portions over ILD 60.

Dipole films 168 and 268 include a dipole-engineering dopant (referred to as dipole dopant hereinafter) such as lanthanum, aluminum, yttrium, Titanium, Magnesium, Niobium, Gallium, Indium or the like. These elements, when diffused into high-k dielectric layers, may increase the number of dipoles, and result in the change in threshold voltages (Vts) of the respective FinFETs. The effect of different dipole dopants on p-type transistors and n-type transistors may be different from each other. For example, La-based dipole dopant will result in the reduction of the Vt of the n-type transistors, and will increase the Vt of p-type transistors. Conversely, Al-based dipole dopant will result in the increase of the Vt of the n-type transistors, and the reduction in the Vt of p-type transistors. Each dipole dopant may exist in both of an n-type transistor and a p-type transistor at the same time, and any combinations of different dipole dopants (as above-mentioned) may exist in an n-type FinFET or a p-type transistor, or in both of a p-type transistor and an n-type transistor at the same time.

The dipole films 168 and 268 may be oxides and/or nitrides of the dipole dopant. For example, the La-containing dipole films 168 and 268 may be in the form of lanthanum oxide ($La_2O_3$), lanthanum nitride (LaN), or the like, or combinations thereof. The Al-containing dipole films 168 and 268 may be in the form of aluminum oxide ($Al_2O_3$), aluminum nitride (AlN), or the like, or combinations thereof. The thickness T4 of dipole films 168 and 268 may be in the range between about 0.3 Å and about 30 Å. It is realized that the thickness T4 of dipole films 168 and 268 may generally be related to the magnitude of the intended threshold voltage tuning, and the greater threshold voltage tuning is intended, the greater thickness T4 is.

Figure 12:
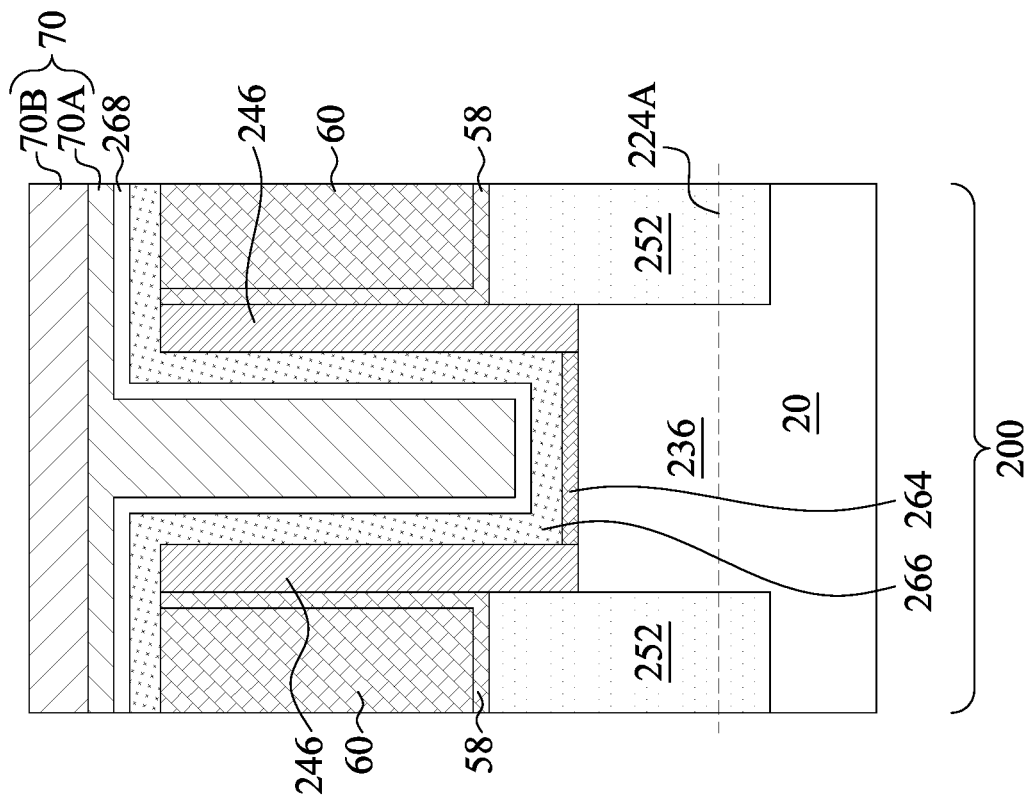
Figure 12:
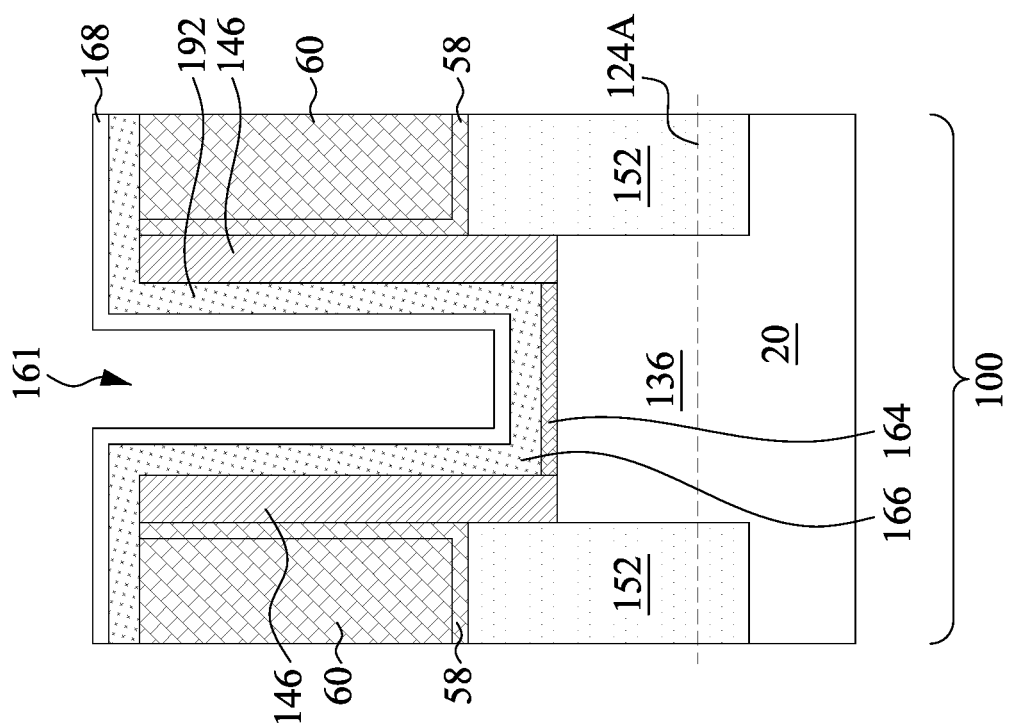

Referring to FIG. 12, etching mask 70 is formed and patterned. In accordance with some embodiments, etching mask 70 includes Bottom Anti-Reflective Coating (BARC) 70A, and photo resist 70B over BARC 70A. A hard mask (not shown) may also be added underlying BARC 70A to assist the etching process. The hard mask may be formed of a metal oxide such as titanium oxide or boron nitride, a metal nitride such as a titanium nitride, or may include a metal nitride layer over a metal oxide layer.

Figure 13:
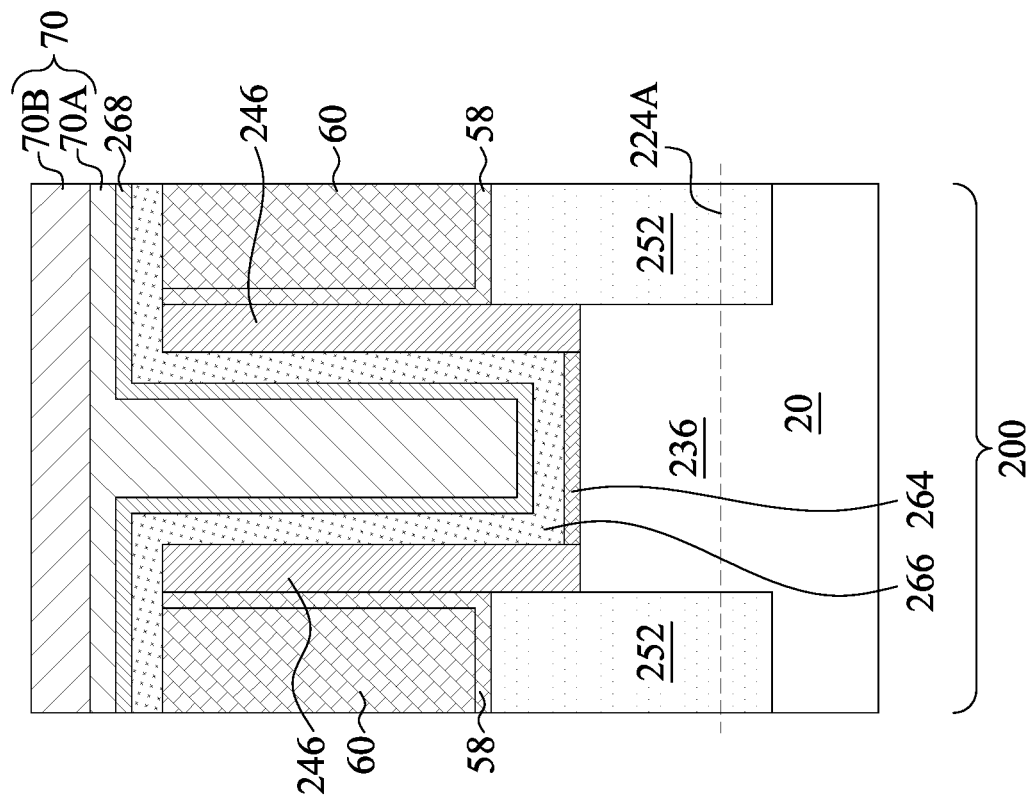
Figure 13:
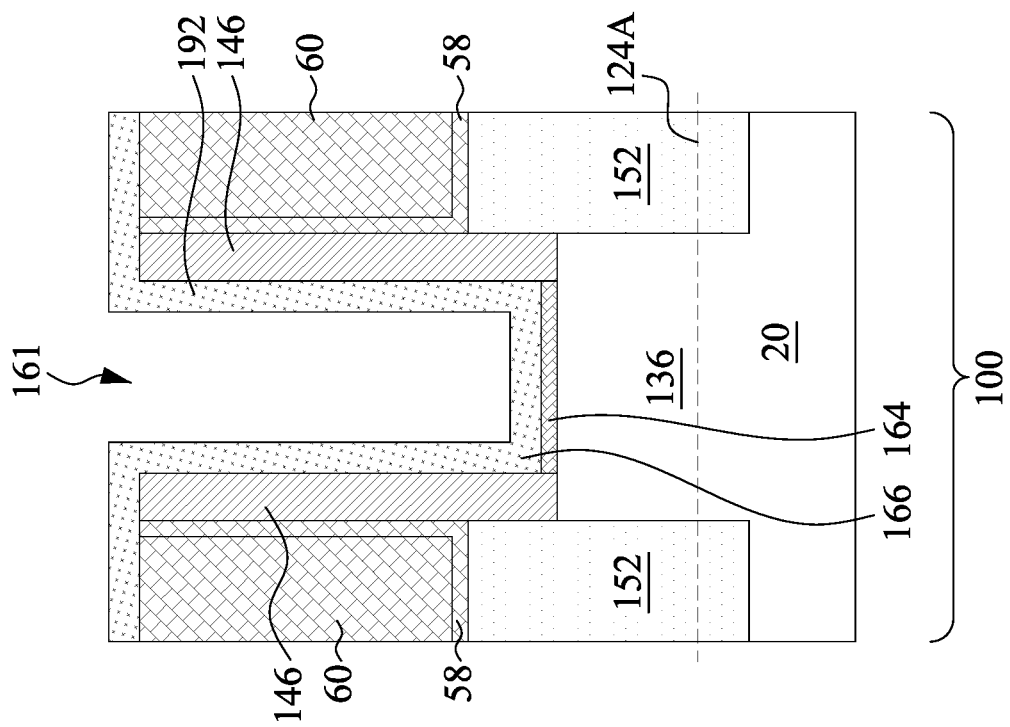

Next, an etching process is performed, in which etching mask 70 is used to remove dipole film 168. The respective process is illustrated as process 426 in the process flow 400 as shown in FIG. 24. As a result, high-k dielectric layer 166 is revealed. The resulting structure is shown in FIG. 13. In accordance with some embodiments of the present disclosure, the etching process is performed through wet etching. For example, when dipole film 168 is formed of the La-based material, an acidic wet etching chemical solution may be adopted. For example, the wet etching chemical may include an acid such as HCl, $H_2SO_4$, $H_2CO_3$, HF, for the like, and the acid may be mixed with hydrogen peroxide ($H_2O_2$) and water, and/or the like. When dipole film 168 is formed of the Al-based material, an alkaline wet etching chemical solution may be adopted. For example, the wet etching chemical may include ammonia ($NH_3$), hydrogen peroxide ($H_2O_2$), and water, and/or the like.

Figure 14:
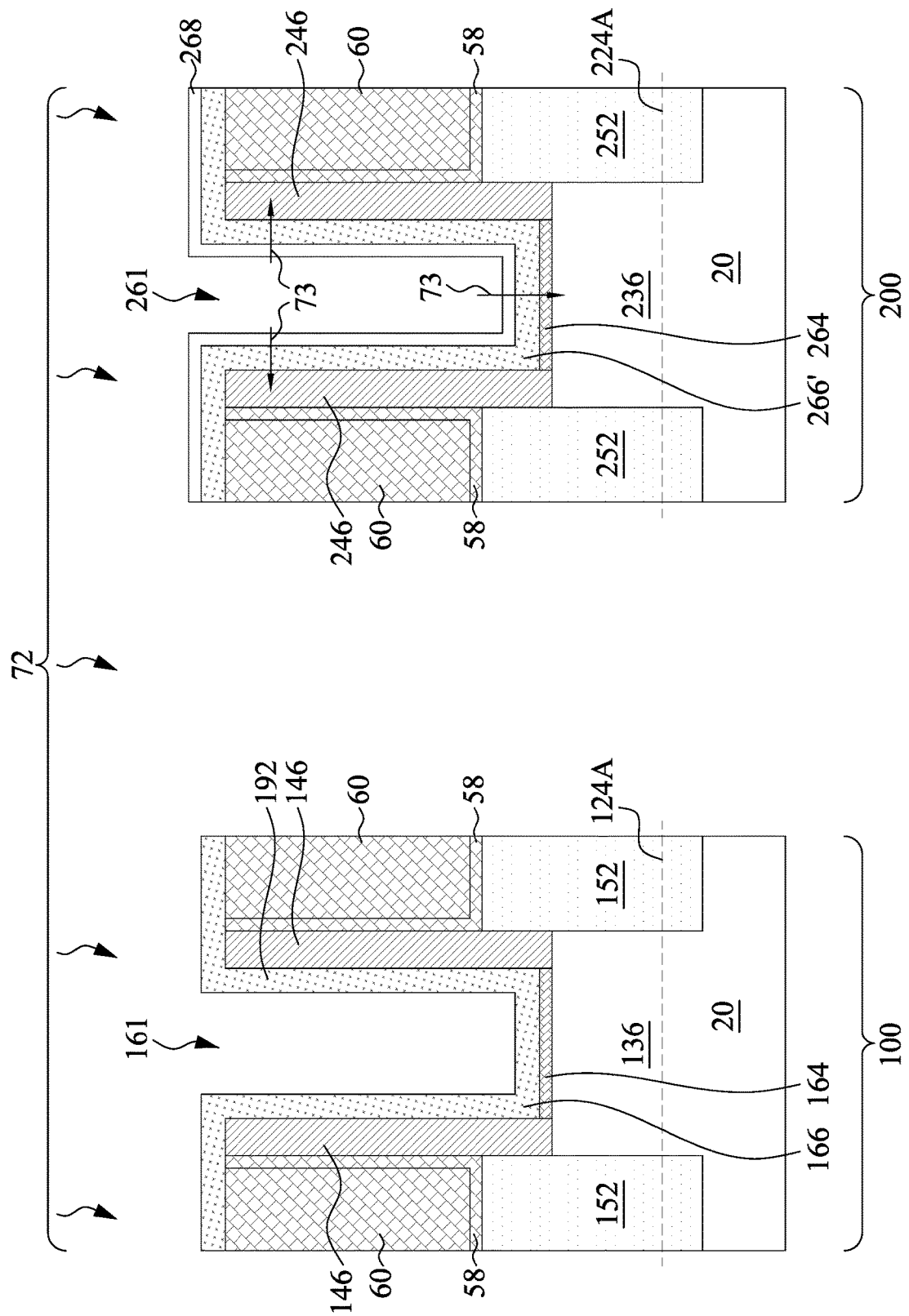

Etching mask 70 is then removed, resulting in the structure shown in FIG. 14, in which dipole film 268 remains over high-k dielectric layer 266, while no dipole film is over high-k dielectric layer 166. Further referring to FIG. 14, drive-in annealing process 72 is performed. The respective process is illustrated as process 428 in the process flow 400 as shown in FIG. 24. In accordance with some embodiments, annealing process 72 is performed through soak annealing, spike rapid thermal annealing, or the like. When the soak anneal is adopted, the annealing duration may be in the range between about 5 seconds and about 5 minutes. The annealing temperature may be in the range between about 500° C. and about 950° C. The annealing process may be performed in a process gas such as $N_2$, $H_2$, $NH_3$, or the mixture thereof. When the spike rapid thermal annealing process is adopted, the annealing duration may be in the range between about 0.5 seconds and about 3.5 seconds. The annealing temperature may be in the range between about 700° C. and about 950° C. The annealing process may also be performed in a process gas such as $N_2$, $H_2$, $NH_3$, or the mixture thereof. The annealing results in the dipole dopant to be driven into high-k dielectric layer 266. Throughout the description, the high-k dielectric layer 266 doped with the dipole dopant is referred to as (dipole-dopant containing) high-k dielectric layer 266'. Due to the nature of diffusion, the highest concentration of the dipole dopant is at the interface between layers 266' and 268, and the dopant concentration gradually reduces in the directions of arrows 73. In accordance with some embodiments, the dosage of the dipole dopant in high-k dielectric layer and the underlying layers is in the range between about 0 atom/$cm^2$ and about 1E17 atoms/$cm^2$.

Figure 15:
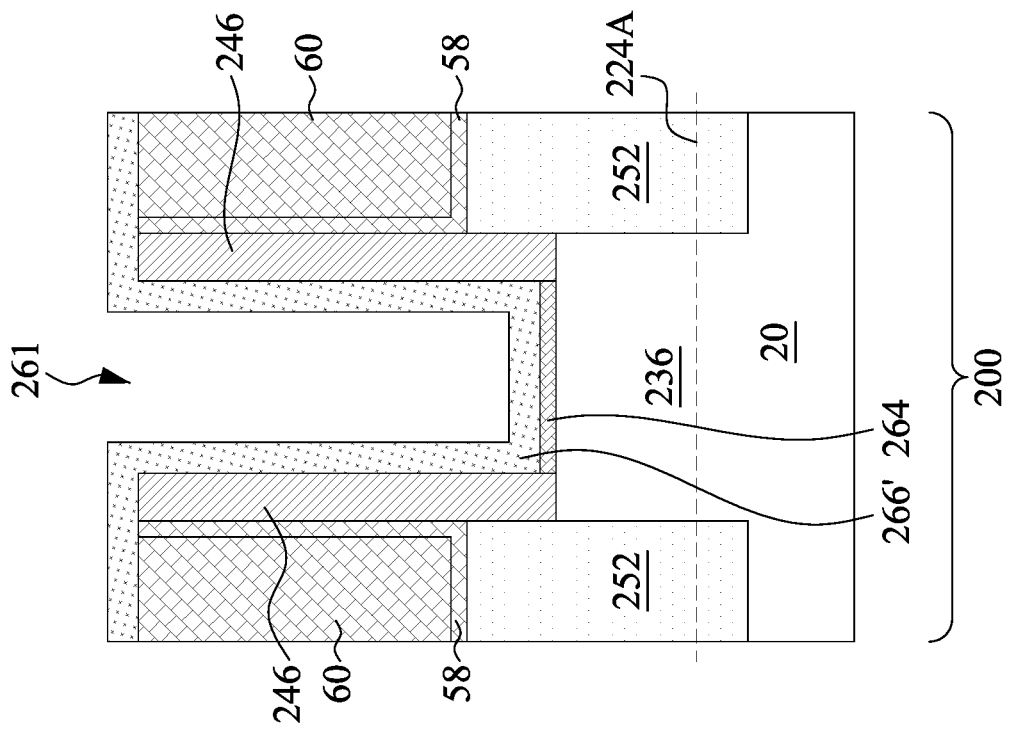
Figure 15:
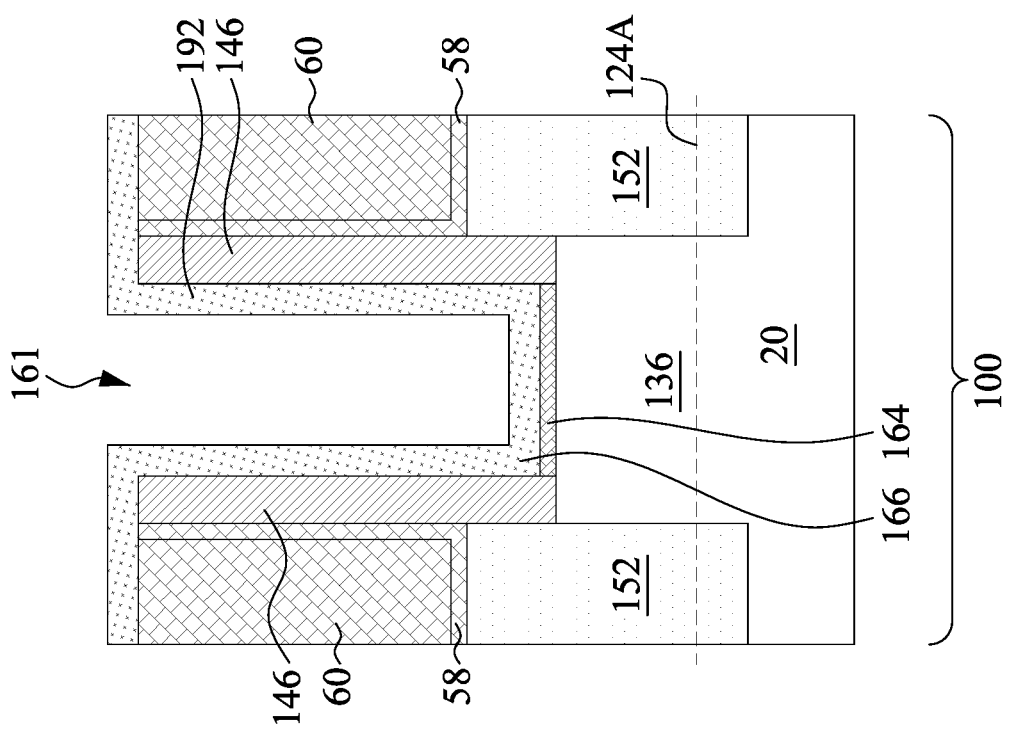

After the drive-in annealing process 72, dipole film 268 is removed in an etching process. The respective process is illustrated as process 430 in the process flow 400 as shown in FIG. 24. The etching process may be selected from the same group of candidate processes, and using the same group of candidate etching chemicals, as the etching process shown in FIG. 12. The details are thus not repeated herein. The resulting structure is shown in FIG. 15.

In accordance with alternative embodiments and/or in another device region, the process of removing dipole film 168 before the drive-in annealing process 72 is omitted. Accordingly, the dipole dopant in dipole film 168 is also diffused into high-k dielectric 166. In accordance with these embodiments, both of high-k dielectric layers 166 and 266 are doped with dipole dopants.

FIGS. 16 through 20 illustrate the deposition of a second high-k dielectric layer and a second drive-in annealing process in accordance with some embodiments. It is appreciated that some of the materials and the process details may be the same as the preceding processes shown in FIGS. 11 through 15. These details are not repeated, and may be found referring to the description of the preceding processes.

Figure 16:
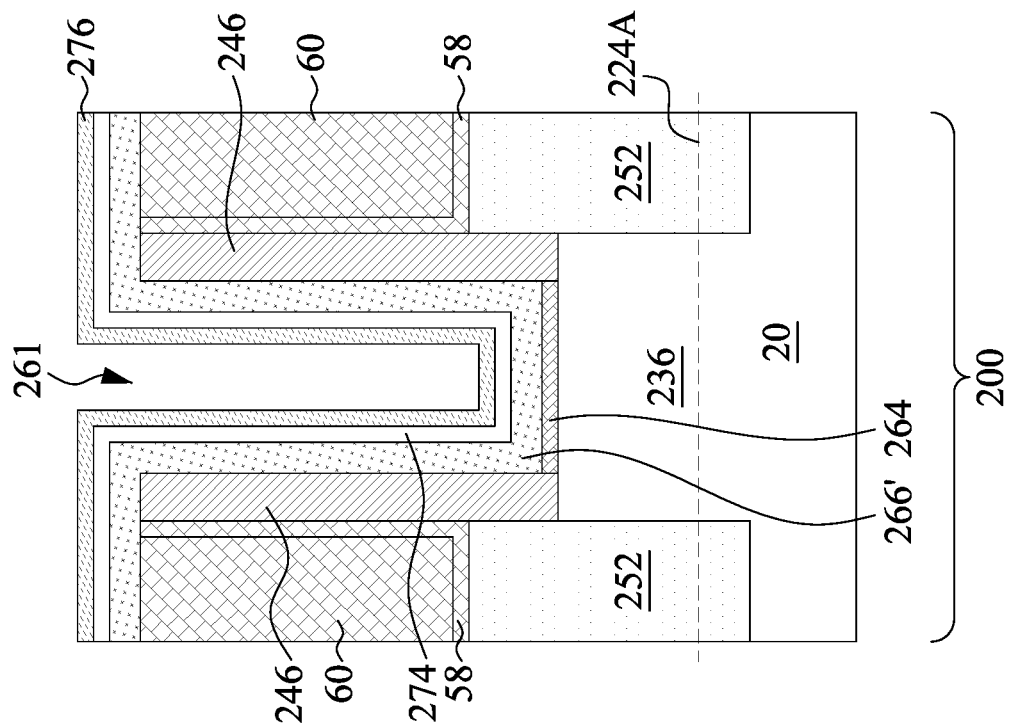
Figure 16:
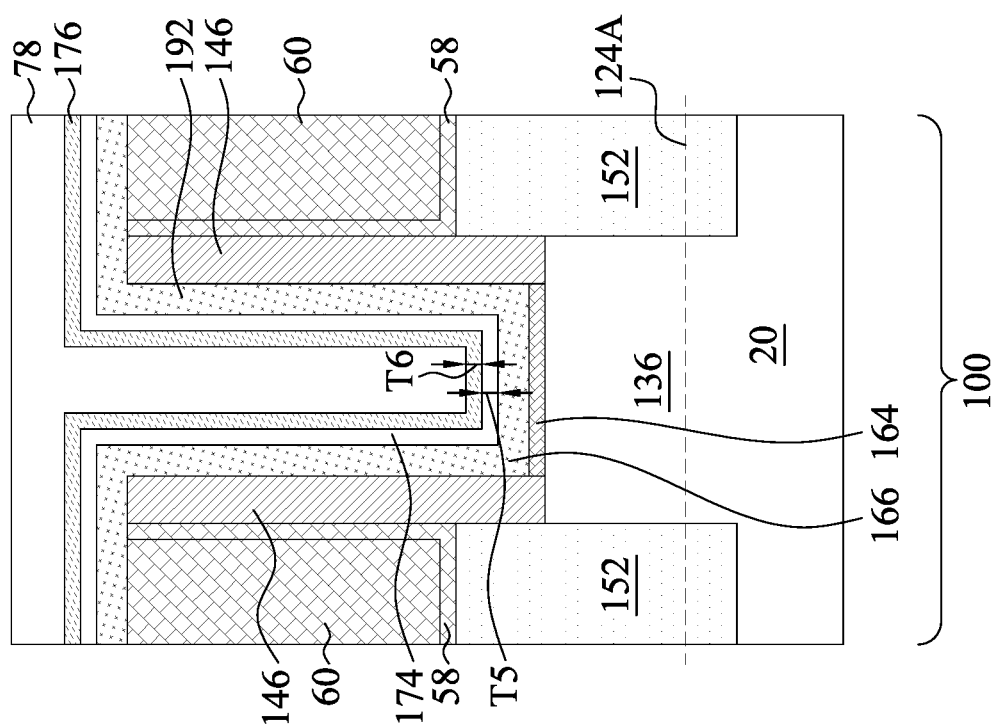

Referring to FIG. 16, high-k dielectric layers 174 and 274 are deposited. The respective process is illustrated as process 432 in the process flow 400 as shown in FIG. 24. The material of high-k dielectric layers 174 and 274 may be selected from the same group of candidate materials for forming high-k dielectric layers 166 and 266 (FIG. 11), and may include $HfO_2$, $ZrO_2$, $TiO_2$, or the like, or the combinations thereof such as HfZrO, HMO, or the like. High-k dielectric layers 174 and 274 are overlying, and may contact, the respective underlying high-k dielectric layers 166 and 266. In accordance with some embodiments of the present disclosure, high-k dielectric layers 174 and 274 are formed using ALD or CVD. The deposition temperature may be in the range between about 200° C. and about 400° C. The thickness T5 may be equal to or smaller than the thickness of the underlying high-k dielectric layers 166 and 266'. For example, thickness T5 may be in the range between about 1 Å and about 20 Å.

In accordance with some embodiments, high-k dielectric layers 174 and 274 are formed of a material having a k value lower than the k value of high-k dielectric layer 166. For example, high-k dielectric layers 174 and 274 may be formed of $HfO_2$, while high-k dielectric layers 166 and 266 may be formed of $ZrO_2$ or $TiO_2$. In accordance with alternative embodiments, high-k dielectric layers 174 and 274 have a same k value, and are formed of a same material, as high-k dielectric layers 166 and 266. In accordance with yet alternative embodiments, high-k dielectric layers 174 and 274 have a greater k value than high-k dielectric layers 166 and 266. For example, high-k dielectric layers 174 and 274 may be formed of $ZrO_2$ or $TiO_2$, while high-k dielectric layers 166 and 266 may be formed of $HfO_2$.

Further referring to FIG. 16, dipole films 176 and 276 are formed through a conformal deposition process such as an ALD process or a CVD process. The respective process is illustrated as process 434 in the process flow 400 as shown in FIG. 24. Dipole films 176 and 276 include a dipole dopant such as lanthanum (such as $La_2O_3$ or LaN), aluminum (such as $Al_2O_3$ or AlN), or the like. The dipole dopant of dipole films 176 and 276 may be the same or different from that of dipole films 168 and 268. The thickness T6 of dipole films 176 and 276 may be in the range between about 0.3 Å and about 30 Å.

Figure 17:
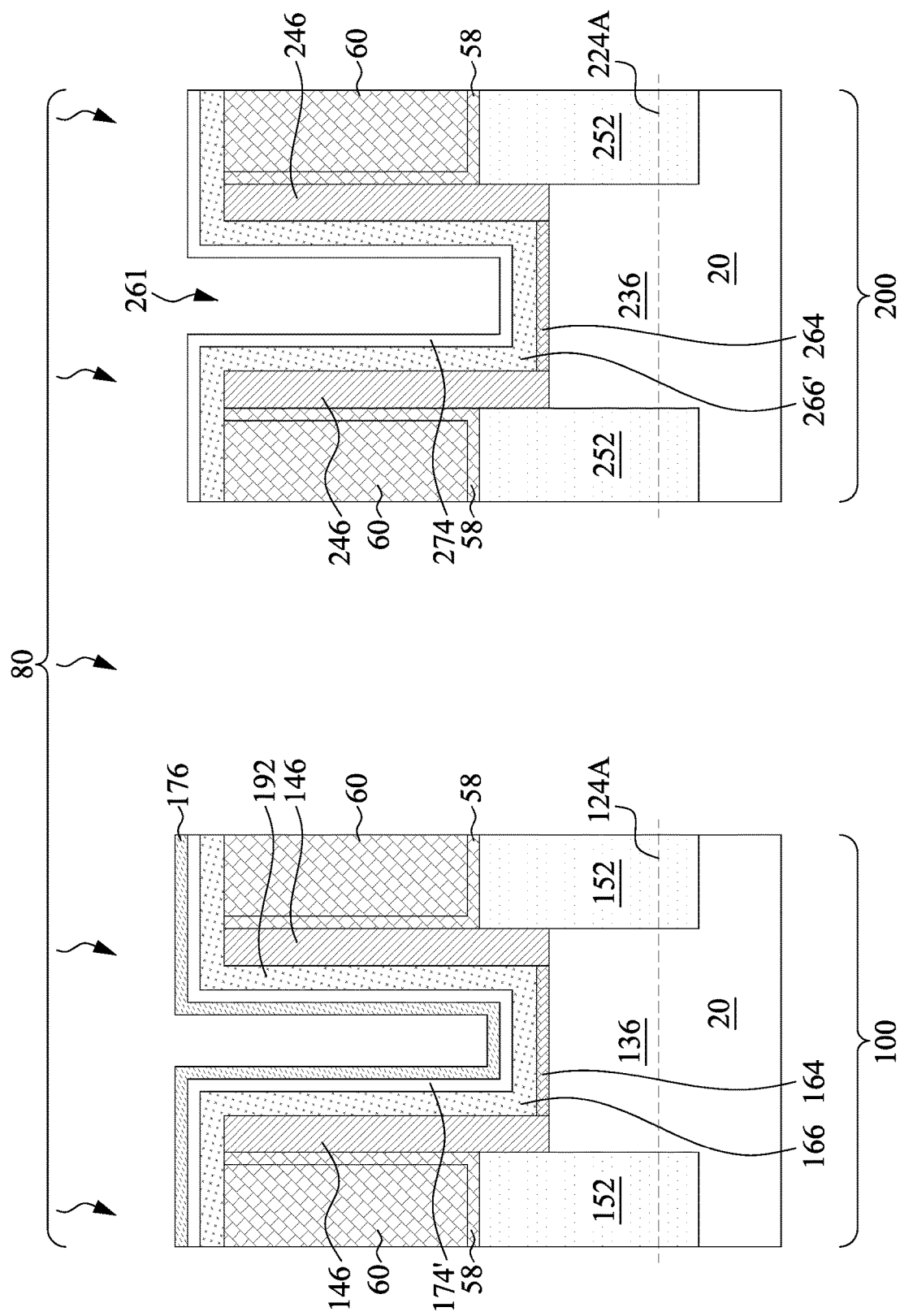

FIG. 16 further illustrates the formation of etching mask 78, which may have a structure similar to that of etching mask 70. The details are thus not repeated herein. In a subsequent process, an etching process is performed to remove dipole film 276, and hence high-k dielectric layer 274 is exposed, as shown in FIG. 17. The respective process is illustrated as process 436 in the process flow 400 as shown in FIG. 24. The etching process may be the same as shown in FIGS. 12 and 13. Etching mask 78 (shown in FIG. 16) is then removed, revealing dipole film 176.

Further referring to FIG. 17, drive-in annealing process 80 is performed. The respective process is illustrated as process 438 in the process flow 400 as shown in FIG. 24. The drive-in annealing process 80 is similar to the drive-in annealing process 72 in FIG. 14, and thus the details are not repeated herein. The dipole dopant in dipole film 176 is diffused into high-k dielectric layer 174, and possibly high-k dielectric layer 166 with a lower doping concentration than in high-k dielectric layer 174. In subsequent paragraphs, the high-k dielectric layer 174 incorporating the dipole dopant is referred to as (dipole-dopant containing) high-k dielectric layer 174'.

Figure 18:
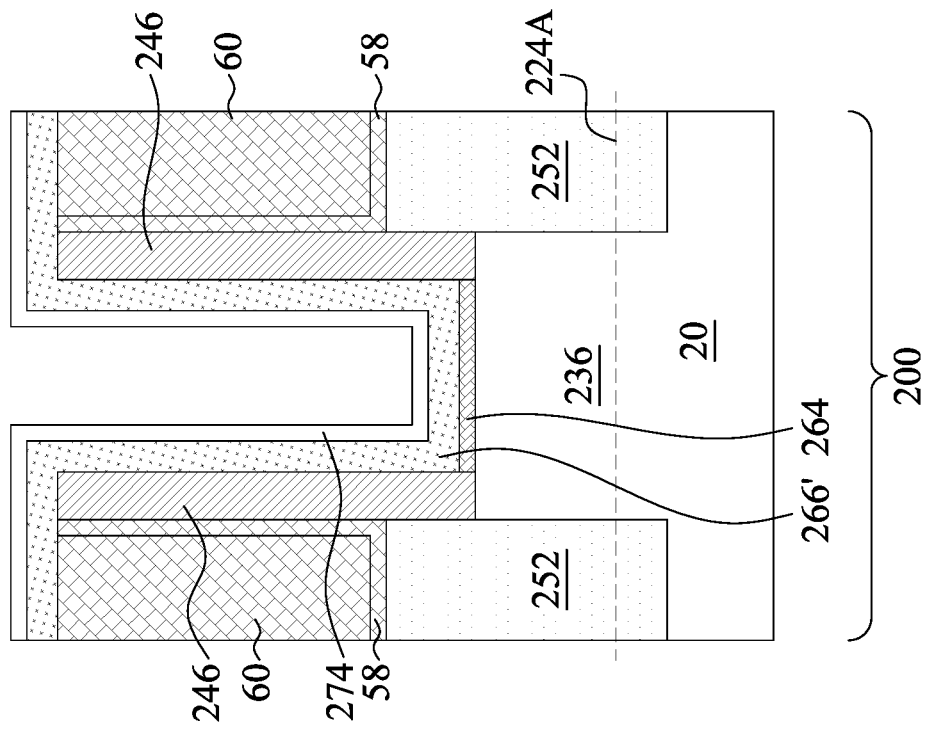
Figure 18:
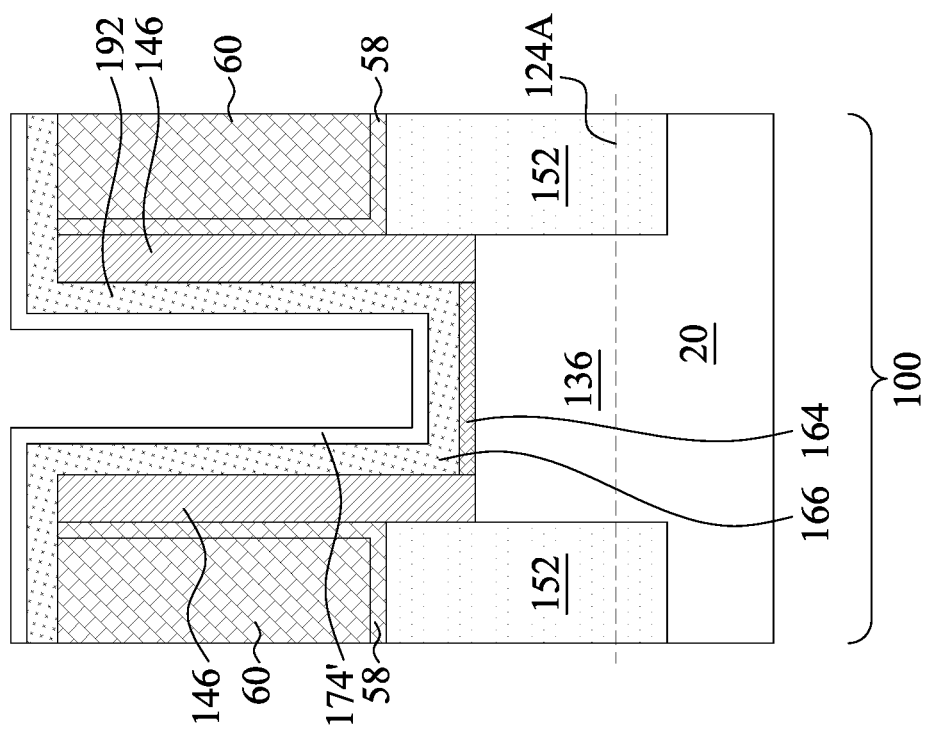

After the drive-in annealing process, dipole film 176 is removed in an etching process. The respective process is illustrated as process 440 in the process flow 400 as shown in FIG. 24. The etching process may be selected from the same group of candidate processes, and using the same group of candidate etching chemicals, as the etching process shown in FIG. 12. The details are thus not repeated herein. The resulting structure is shown in FIG. 18.

In accordance with alternative embodiments and/or in another device region, the process of removing dipole film 276 before drive-in annealing process 80 is omitted. Accordingly, the dipole dopant in dipole film 276 is also diffused into high-k dielectric 274. In accordance with these embodiments, both of high-k dielectric layers 174 and 274 are doped with dipole dopants.

As aforementioned, the k-value of the lower high-k dielectric layers 166/266 may be smaller than, equal to, or greater than, the k-value of the upper high-k dielectric layers 174/274. Furthermore, dipole dopant doping may be performed on the lower high-k dielectric layer (such as 266) or upper high-k dielectric layer (such as 174). Doping lower high-k dielectric layer has different effect in adjusting Vt than doping upper high-k dielectric layer. For example, doping lower high-k dielectric layer may change Vt more than doping upper high-k dielectric layer. In addition, doping a high-k dielectric layer having a lower k-value has different effect in adjusting Vt than doping a high-k dielectric layer having a higher k-value. For example, doping a high-k dielectric layer having a higher k-value may change Vt more than doping a high-k dielectric layer having a lower k-value. Therefore, by selecting whether the upper high-k dielectric layer has a higher, an equal, or a lower k-value (with three possibilities) than the lower high-k dielectric layer, and selecting whether to dope the upper high-k dielectric layer, the lower high-k_dielectric layer, or both (with three possibilities), 9 (3×3) potential Vt-adjusting levels are resulted. In accordance with some embodiments, on a same chip, the FinFETs with these different Vt-adjusting levels are formed according to design requirement. In addition, since different dipole dopants such as La and Al also have Vt-adjusting ability different from each other, the Vt-adjusting levels are further multiplied by adopting different dipole dopants for different FinFETs.

Figure 19:
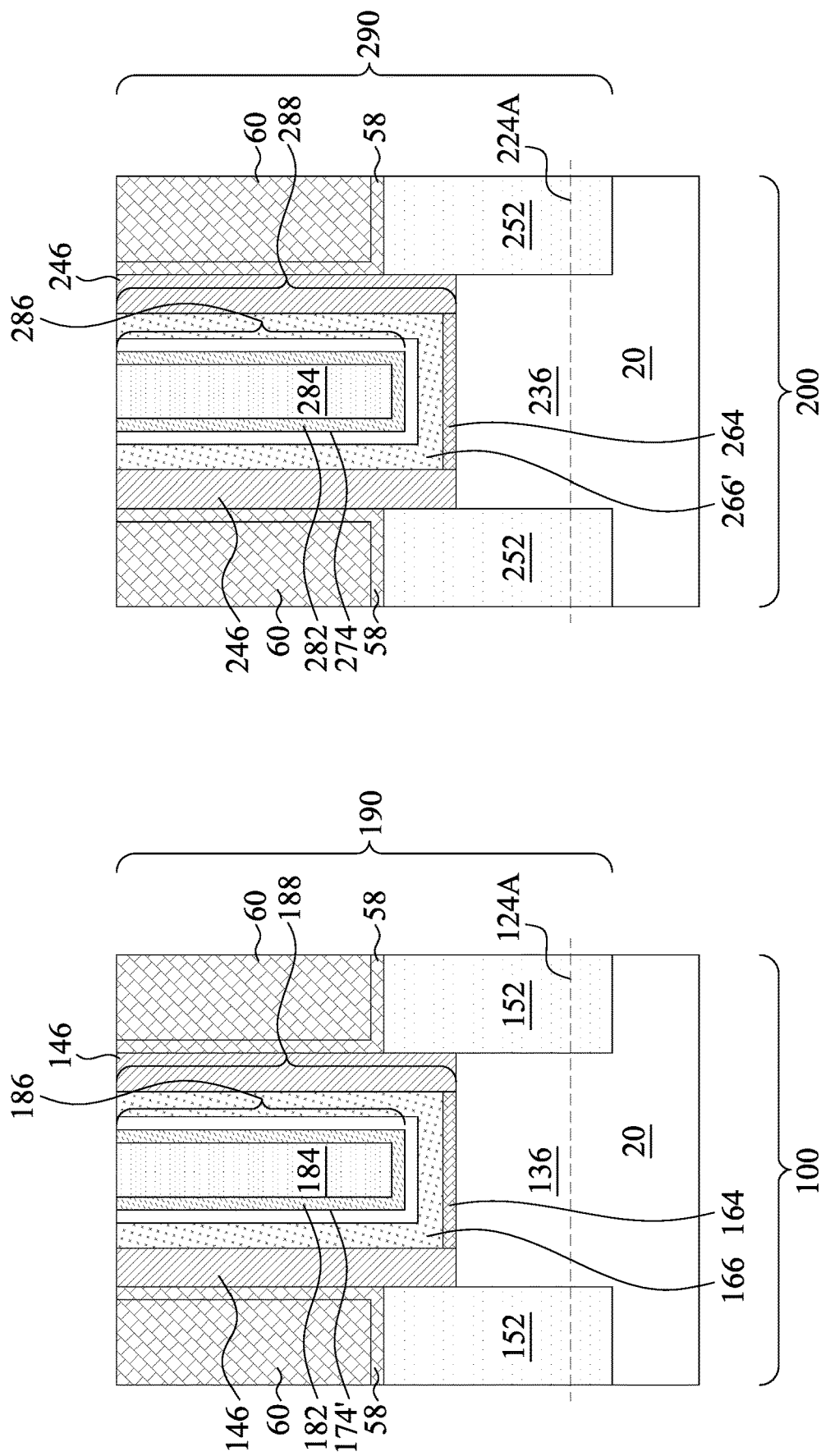

FIG. 19 illustrates the formation of gate electrodes 186 and 286, which includes stacked layers 182 and 282 and possibly metal-filling regions 184 and 284, respectively. The respective process is illustrated as process 442 in the process flow 400 as shown in FIG. 24. In accordance with some embodiments of the present disclosure, each of stacked layers 182 and 282 includes an adhesion layer (also known as barrier layer, not shown), which may be formed of TiN, TiSiN, or the like. The stacked layers 182 and 282 also include work function layers, which may include TiN layer, TaN, and/or an Al-based layer (formed of, for example, TiAlN, TiAlC, TaAlN, or TaAlC), depending on whether the respective FinFETs are p-type FinFETs or n-type FinFETs. A blocking layer (not shown) and a filling metal, which are represented by layers 184 and 284, are then deposited if layers 182 and 282 have not fully fill trenches. Otherwise, layers 184 and 284 are not needed. A planarization process such as a CMP process or a mechanical grinding process is then performed, forming gate electrodes 186 and 286. Replacement gate stacks 188 and 288, which include the corresponding gate electrodes 186 and 286 and the corresponding gate dielectrics 164/166/174' and 264/266'/274 are also formed. FinFETs 190 and 290 are thus formed.

Figure 20:
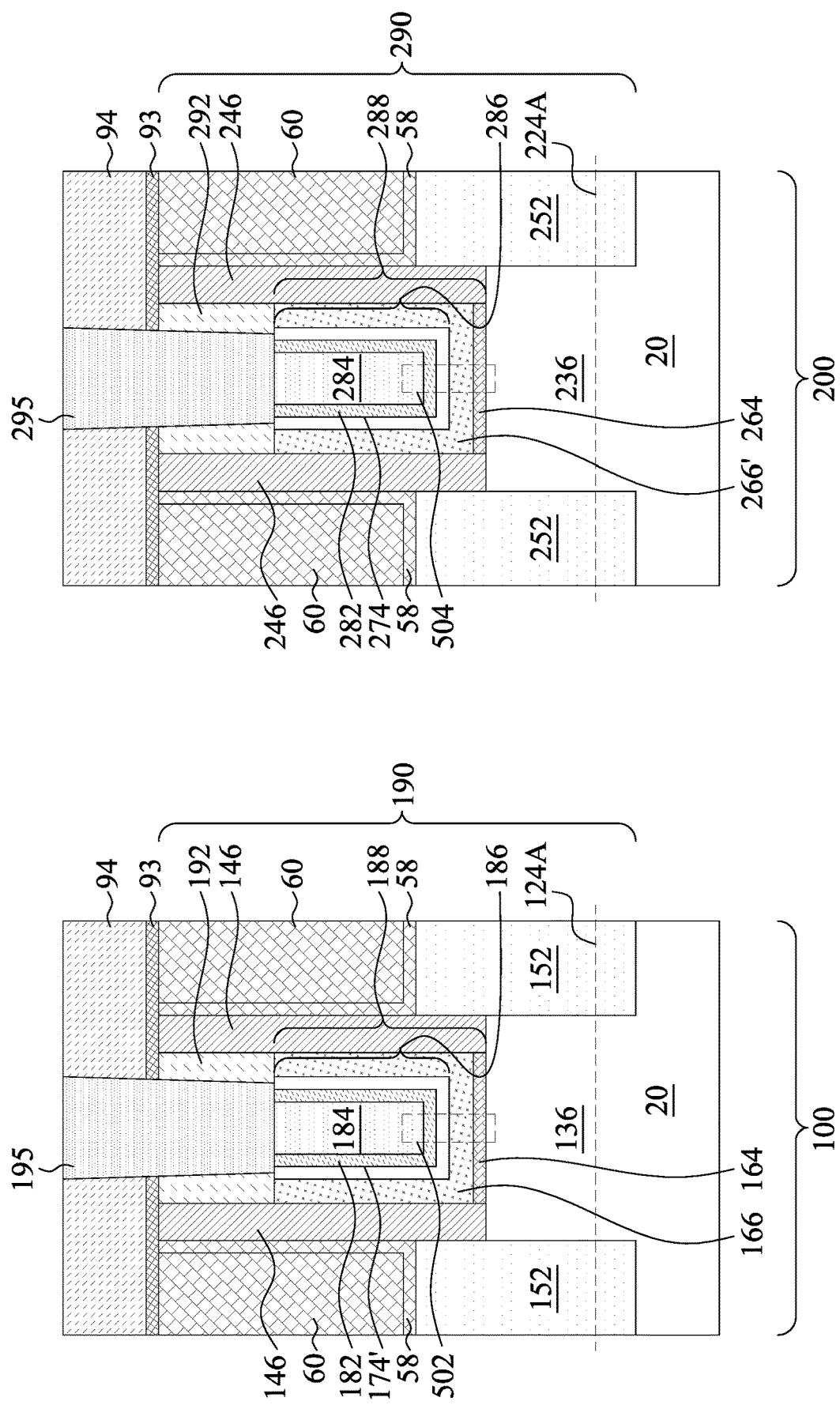

Referring to FIG. 20, gate stacks 188 and 288 are recessed, and are filled with a dielectric material (such as SiN) to form hard masks 192 and 292. Etch stop layer 93 is formed over hard masks 192 and 292 and ILD 60. Etch stop layer 93 is formed of a dielectric material, which may include silicon carbide, silicon nitride, silicon oxynitride, or the like. ILD 94 is formed over etch stop layer 78, and gate contact plugs 195 and 295 are formed.

Figure 21:
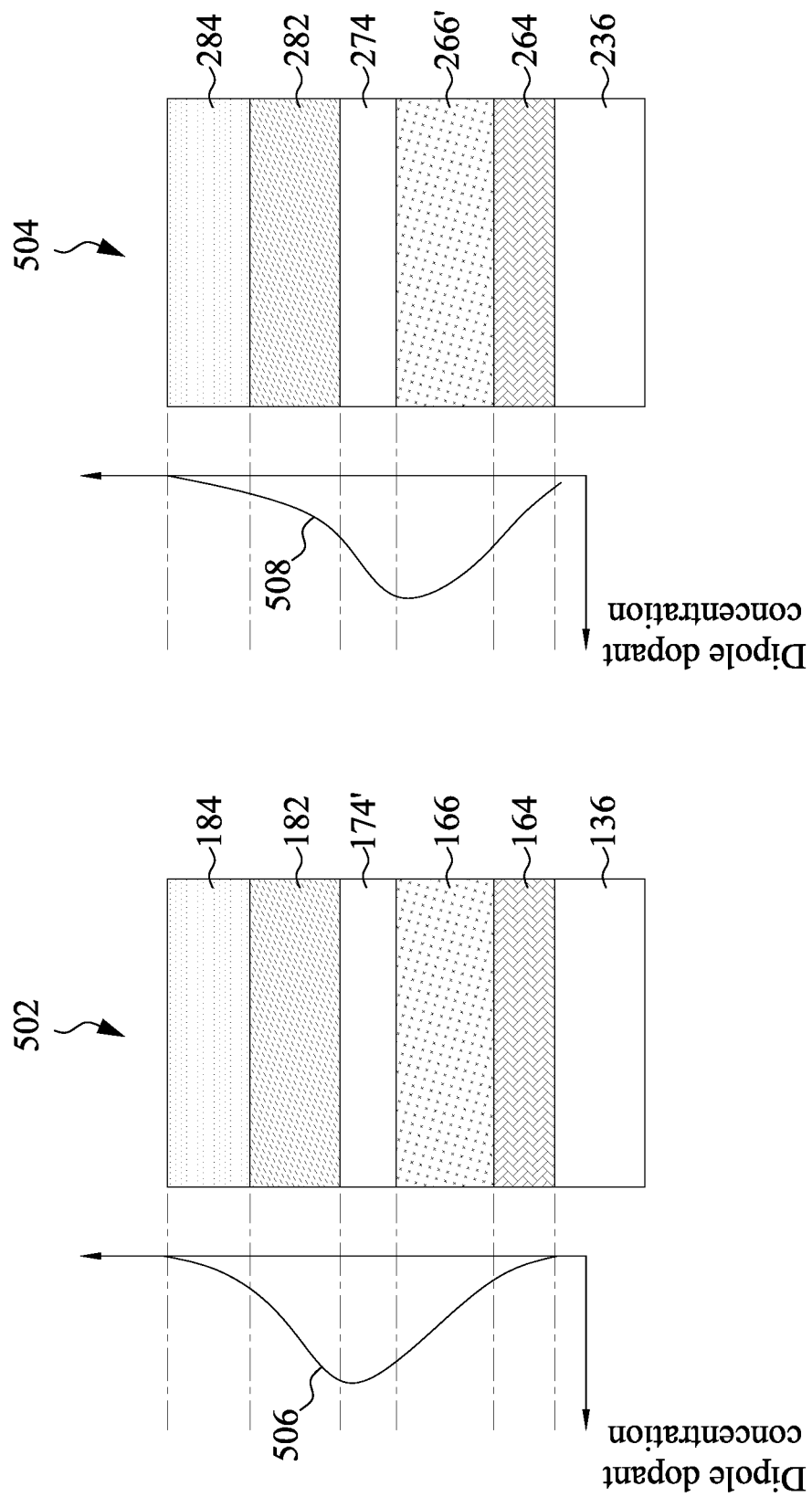
FIGS. 21 through 23 illustrate the distributions of dipole dopants in accordance with some embodiments.

FIG. 21 illustrates the distribution of dipole dopants in some portions of the gate stacks shown in FIG. 20. A magnified view of region 502 in gate stack 188 (FIG. 20) and a magnified view of region 504 (FIG. 20) in gate stack 288 are shown in FIG. 21. The schematic dopant concentrations are shown on the left sides of the corresponding magnified views of regions 502 and 504. In region 502, before the formation of stacked metal layers 182, the peak concentration of dipole concentration occurs at the top surface of high-k dielectric layer 174'. In subsequent thermal processes, the dipole dopant diffuses upwardly and downwardly, and hence resulting in the dopant profile as shown in FIG. 21, in which the peak dipole dopant concentration profile 506 is at (or slightly lower than) the top surface of high-k dielectric layer 174'. The dipole dopant concentration reduces gradually in upward and downward directions. In region 504, the peak dipole dopant concentration profile 508 is at (or slightly lower than) the top surface of high-k dielectric layer 266', and reduces gradually in upward and downward directions.

Figure 22:
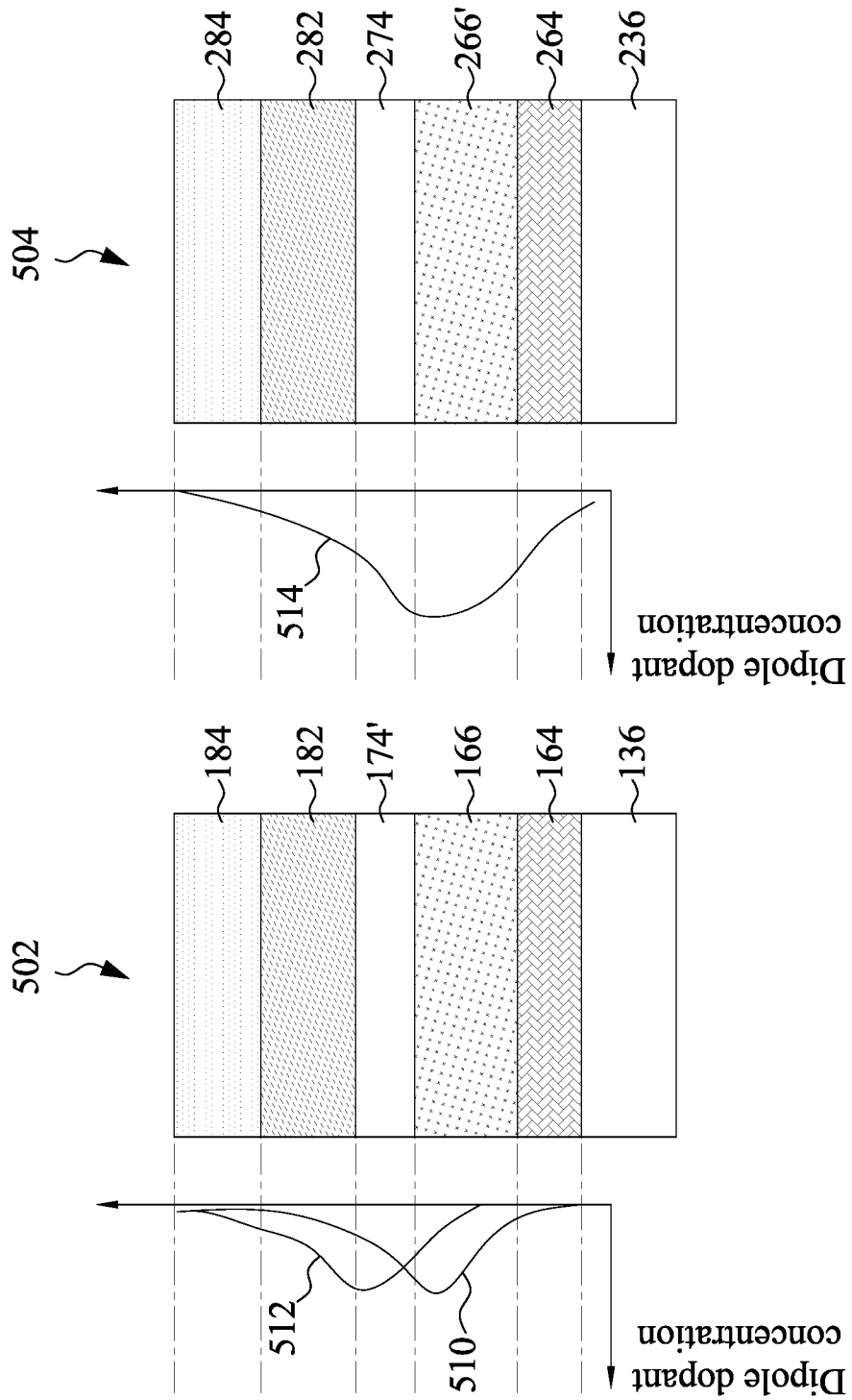

FIG. 22 illustrates the dopant concentration assuming that when the drive-in annealing process 72 as shown in FIG. 14 is performed, the dipole film 168 (FIG. 12) is not removed. Accordingly, in region 502, high-k dielectric layers 166 is also diffused with dipole dopant, and hence forming high-k dielectric layers 166'. The resulting dipole dopant concentration profiles 510 and 512 are schematically illustrated, with dipole dopant concentration profile 510 representing the dopant of dipole film 168, which has the peak at (or slightly lower than) the top surface of high-k dielectric layer 166'. Dipole dopant concentration profile 512 represents the dopant of dipole film 176, which has the peak at (or slightly lower than) the top surface of high-k dielectric layers 174'. The total dipole dopant concentration is thus the sum of dipole dopant concentration profiles 510 and 512. The dipole dopant of profiles 510 and 512 may be the same as each other or different from each other. For example, the dopant of one of profiles 520 and 512 may be La, while the other may be Al. Although La and Al may have opposite effects (with one increasing Vt, and the other reducing Vt), the combination results in an additional Vt level.

Figure 23:
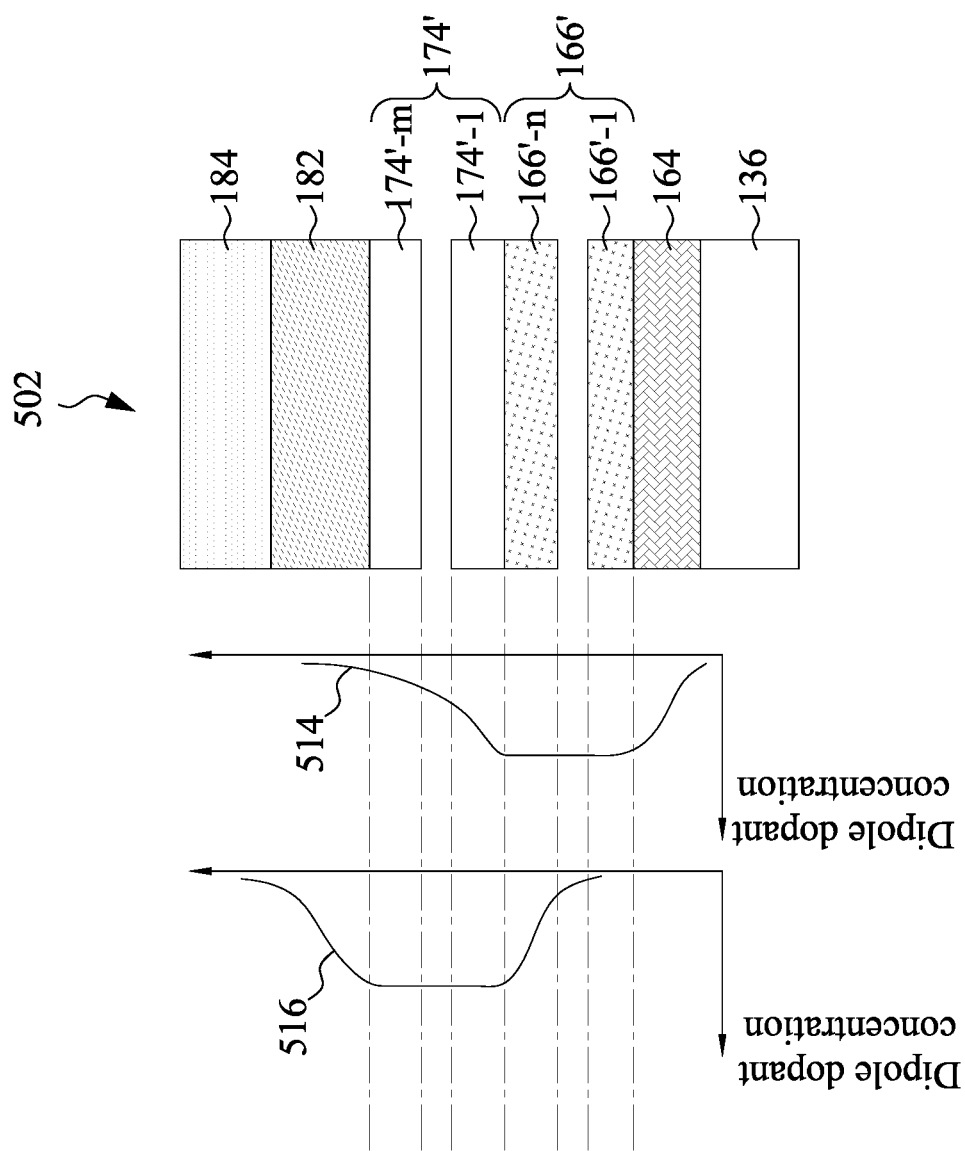

FIG. 23 illustrates an example embodiment, in which each of high-k dielectric layers 166 and 174 is formed through a plurality of deposition processes to form a plurality of sub layers. A plurality of dipole-film deposition processes, drive-in annealing processes, and dopant-film removal processes are inserted between the plurality of deposition processes for each sub layer of the high-k dielectric layers 166 and 174. In accordance with these embodiments, the sub layers of high-k dielectric layer 166 are formed of the same high-k dielectric material and have the same k value. The first dipole dopants of the sub layers of high-k dielectric layer 166 are also the same as each other. Similarly, the sub layers of high-k dielectric layer 174 are formed of the same high-k dielectric material and have the same k value. The second dipole dopants of the sub layers of high-k dielectric layer 174 are also the same as each other. The first dipole dopants may be the same as or different from the second dipole dopants. The profile of the first dipole dopants is shown as 514, and the profile of the second dipole dopants is shown as 516. The alternating deposition and drive-in annealing processes may result in a more uniform dipole dopant distribution.

It is appreciated that the aforementioned embodiments, including FIGS. 21, 22, and 23, may co-exist in the same chip and on the same semiconductor substrate 20. Furthermore, more (such as 1, 2, or 3) high-k dielectric layers may be formed over the dielectric layers shown in FIG. 20, with each of the high-k dielectric layers doped or not doped by a respective subsequent dipole dopant deposition and drive-in annealing process. This creates more adjustment levels of Vt for different FinFETs on the same chip.

The embodiments of the present disclosure have some advantageous features. By forming multiple high-k dielectric layers having the same k values or different k values, and further by selectively doping dipole dopants for selective ones of the high-k dielectric layers, multiple levels of Vt adjustment may be achieved for different circuit requirements. Through the doping of dipoles, the CET values of the transistors are improved, and the CET scaling feasibility is improved.

In accordance with some embodiments of the present disclosure, a method comprises forming a first oxide layer on a first semiconductor region; depositing a first high-k dielectric layer over the first oxide layer, wherein the first high-k dielectric layer is formed of a first high-k dielectric material; depositing a second high-k dielectric layer over the first high-k dielectric layer, wherein the second high-k dielectric layer is formed of a second high-k dielectric material different from the first high-k dielectric material; depositing a first dipole film over and contacting a first layer selected from the first high-k dielectric layer and the second high-k dielectric layer; performing a first annealing process to drive-in a first dipole dopant in the first dipole film into the first layer; removing the first dipole film; and forming a first gate electrode over the second high-k dielectric layer. In an embodiment, the first dipole film is deposited over and contacting the first high-k dielectric layer. In an embodiment, the first dipole film is deposited over and contacting the second high-k dielectric layer. In an embodiment, the second high-k dielectric layer has a higher k value than the first high-k dielectric layer. In an embodiment, the second high-k dielectric layer has a lower k value than the first high-k dielectric layer. In an embodiment, the method further comprises forming a second oxide layer on a second semiconductor region, wherein both of the first high-k dielectric layer and the second high-k dielectric layer further extend on the second oxide layer; depositing a second dipole film over and contacting a second layer selected from the first high-k dielectric layer and the second high-k dielectric layer, wherein the second layer is different from the first layer, and wherein the second dipole film overlaps the second semiconductor region; performing a second annealing process to drive-in a second dipole dopant in the second dipole film into the second layer; removing the second dipole film; and forming a second gate electrode over the second high-k dielectric layer, wherein the second gate electrode overlaps the second semiconductor region. In an embodiment, the method further comprises, before the second annealing process, removing the second dipole film from a region directly over the first semiconductor region. In an embodiment, the first dipole film comprises a material selected from lanthanum oxide, lanthanum nitride, aluminum oxide, aluminum nitride, or combinations thereof.

In accordance with some embodiments of the present disclosure, a device comprises a first oxide layer on a first semiconductor region; a first high-k dielectric layer comprising a first high-k dielectric material; a second high-k dielectric layer comprising a second high-k dielectric material different from the first high-k dielectric material, wherein the second high-k dielectric layer is overlying and contacts the first high-k dielectric layer; a first dipole dopant in the first high-k dielectric layer and the second high-k dielectric layer, wherein a first peak concentration of the first dipole dopant is at a first top surface of the first high-k dielectric layer or a second top surface of the second high-k dielectric layer; a gate electrode over the second high-k dielectric layer; and a source/drain region on a side of the gate electrode. In an embodiment, the first dipole dopant comprises lanthanum. In an embodiment, the first dipole dopant comprises aluminum. In an embodiment, the first peak concentration of the first dipole dopant is at the first top surface, and the device further comprises a second dipole dopant different from the first dipole dopant, wherein the second dipole dopant has a second peak concentration at the second top surface. In an embodiment, a first one of the first dipole dopant and the second dipole dopant is lanthanum, and a second one of the first dipole dopant and the second dipole dopant is aluminum, and both of lanthanum and aluminum are diffused into each of the first high-k dielectric layer and the second high-k dielectric layer. In an embodiment, the second high-k dielectric layer has a lower k value than the first high-k dielectric layer.

In accordance with some embodiments of the present disclosure, a device comprises a first transistor comprising a first portion of a first high-k dielectric layer; a first portion of a second high-k dielectric layer, wherein the second high-k dielectric layer is over the first high-k dielectric layer, and wherein the first high-k dielectric layer and the second high-k dielectric layer have different k values; a first dipole dopant having a first peak concentration at an interface between the first portion of the first high-k dielectric layer and the first portion of the second high-k dielectric layer; and a second transistor comprising a second portion of the first high-k dielectric layer; a second portion of the second high-k dielectric layer; and a second dipole dopant having a second peak concentration at a top surface of the second high-k dielectric layer. In an embodiment, the first dipole dopant is same as the second dipole dopant. In an embodiment, the first dipole dopant and the second dipole dopant are different from each other. In an embodiment, the first dipole dopant and the second dipole dopant are selected from lanthanum and aluminum. In an embodiment, a first one of the first dipole dopant and the second dipole dopant is lanthanum, and a second one of the first dipole dopant and the second dipole dopant is aluminum. In an embodiment, the first transistor and the second transistor are of a same conductivity type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first semiconductor region;
    a first oxide layer on the first semiconductor region;
    a first high-k dielectric layer on the first oxide layer and comprising a first high-k dielectric material;
    a second high-k dielectric layer comprising a second high-k dielectric material different from the first high-k dielectric material, wherein the second high-k dielectric layer is overlying and contacts the first high-k dielectric layer;
    a first dipole dopant in the first high-k dielectric layer and the second high-k dielectric layer, wherein a first peak concentration of the first dipole dopant is at a first top surface of the first high-k dielectric layer or a second top surface of the second high-k dielectric layer;
    a gate electrode over the second high-k dielectric layer; and
    a source/drain region on a side of the gate electrode.

2. The device of claim 1, wherein the first dipole dopant comprises lanthanum.

3. The device of claim 1, wherein the first dipole dopant comprises aluminum.

4. The device of claim 1, wherein the first peak concentration of the first dipole dopant is at the first top surface, and the device further comprises a second dipole dopant different from the first dipole dopant, wherein the second dipole dopant has a second peak concentration at the second top surface.

5. The device of claim 4, wherein a first one of the first dipole dopant and the second dipole dopant is lanthanum, and a second one of the first dipole dopant and the second dipole dopant is aluminum, and both of lanthanum and aluminum are diffused into each of the first high-k dielectric layer and the second high-k dielectric layer.

6. The device of claim 1, wherein the second high-k dielectric layer has a lower k value than the first high-k dielectric layer.

7. The device of claim 1, wherein the first semiconductor region comprises a semiconductor fin.

8. The device of claim 1, wherein the source/drain region is a p-type region.

9. The device of claim 1, wherein the source/drain region is an n-type region.

10. The device of claim 1 further comprising:
    a second semiconductor region;
    a second oxide layer on the second semiconductor region;
    a third high-k dielectric layer on the second oxide layer and comprising the first high-k dielectric material;
    a fourth high-k dielectric layer comprising the second high-k dielectric material, wherein the fourth high-k dielectric layer is overlying and is in contact with the third high-k dielectric layer; and
    a second dipole dopant in the third high-k dielectric layer and the fourth high-k dielectric layer, wherein a third peak concentration of the second dipole dopant is at a third top surface of the fourth high-k dielectric layer.

11. A device comprising:
    a first transistor comprising:
        a first portion of a first high-k dielectric layer;
        a first portion of a second high-k dielectric layer, wherein the second high-k dielectric layer is over the first high-k dielectric layer, and wherein the first high-k dielectric layer and the second high-k dielectric layer have different k values;
        a first dipole dopant having a first peak concentration at an interface between the first portion of the first high-k dielectric layer and the first portion of the second high-k dielectric layer; and
    a second transistor comprising:
        a second portion of the first high-k dielectric layer;
        a second portion of the second high-k dielectric layer; and
        a second dipole dopant having a second peak concentration at a top surface of the second portion of the second high-k dielectric layer.

12. The device of claim 11, wherein the first dipole dopant is same as the second dipole dopant.

13. The device of claim 11, wherein the first dipole dopant is different from the second dipole dopant.

14. The device of claim 11, wherein the first dipole dopant and the second dipole dopant are selected from lanthanum and aluminum.

15. The device of claim 11, wherein a first one of the first dipole dopant and the second dipole dopant is lanthanum, and a second one of the first dipole dopant and the second dipole dopant is aluminum.

16. The device of claim 15, wherein the first transistor and the second transistor are of a same conductivity type.

17. A device comprising:
    a semiconductor fin;
    a first high-k dielectric layer comprising a first high-k dielectric material, wherein the first high-k dielectric layer is on the semiconductor fin;
    a second high-k dielectric layer comprising a second high-k dielectric material different from the first high-k dielectric material, wherein the second high-k dielectric layer is overlying and contacts the first high-k dielectric layer;
    a dipole dopant in the first high-k dielectric layer and the second high-k dielectric layer, wherein the dipole dopant has a peak concentration at an interface between the first high-k dielectric layer and the second high-k dielectric layer;
    a gate electrode over the second high-k dielectric layer; and
    a source/drain region on a side of the gate electrode.

18. The device of claim 17, wherein the source/drain region is an n-type region, and the dipole dopant is an n-type dopant.

19. The device of claim 17, wherein the source/drain region is an n-type region, and the dipole dopant is a p-type dopant.

20. The device of claim 17, wherein from the interface going into the first high-k dielectric layer and the second high-k dielectric layer, dipole dopant concentrations of the dipole dopant gradually reduce.

* * * * *